United States Patent
Sestok, IV et al.

(10) Patent No.: US 12,000,892 B2
(45) Date of Patent: Jun. 4, 2024

(54) DEVICE UNDER TEST (DUT) MEASUREMENT CIRCUIT HAVING HARMONIC MINIMIZATION

(71) Applicant: TEXAS INSTRUMENTS INCORPORATED, Dallas, TX (US)

(72) Inventors: Charles Kasimer Sestok, IV, Dallas, TX (US); David Patrick Magee, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 44 days.

(21) Appl. No.: 17/589,779

(22) Filed: Jan. 31, 2022

(65) Prior Publication Data

US 2022/0268838 A1 Aug. 25, 2022

Related U.S. Application Data

(60) Provisional application No. 63/153,508, filed on Feb. 25, 2021.

(51) Int. Cl.
*G01R 31/00* (2006.01)
*G01R 31/3167* (2006.01)
*G01R 31/319* (2006.01)
*H03M 1/06* (2006.01)
*H03M 1/10* (2006.01)

(52) U.S. Cl.
CPC ... *G01R 31/31922* (2013.01); *G01R 31/3167* (2013.01); *G01R 31/31924* (2013.01); *H03M 1/0629* (2013.01); *H03M 1/1071* (2013.01)

(58) Field of Classification Search
CPC ........ G01R 31/31908; G01R 31/31922; G01R 31/31924; G01R 31/3167; G01R 31/389; G01R 31/2837; G01R 23/20; H03M 1/0629; H03M 1/1033; H03M 1/1071; H03M 1/1085; H03M 1/1095
See application file for complete search history.

(56) References Cited

U.S. PATENT DOCUMENTS

| | | | |
|---|---|---|---|
| 5,710,517 A * | 1/1998 | Meyer | H03K 5/135 327/296 |
| 11,283,458 B1 * | 3/2022 | Hofman | H03M 1/1085 |
| 2002/0066062 A1 * | 5/2002 | Tanner | G01R 31/318533 714/734 |

(Continued)

*Primary Examiner* — Thang X Le
(74) *Attorney, Agent, or Firm* — Frank D. Cimino

(57) ABSTRACT

A circuit configured to: generate a reference clock signal; generate an excitation signal at a target frequency having a period that is a first integer number of cycles of the reference clock signal; update a driver circuit at an update frequency having a period that is a second integer number of cycles of the reference clock signal; digitize sense signals resulting from the excitation signal at a frequency having a period that is a third integer number of cycles of the reference clock signal; identify a fourth integer number of sense signal samples; optionally utilize an excitation control signal having a period that is a fifth integer number of cycles of the reference clock signal; and minimize harmonics at the target frequency of the excitation signal based on the first integer number, the second integer number, the third integer number, the fourth integer number, and possibly the fifth integer number.

23 Claims, 13 Drawing Sheets

(56) References Cited

U.S. PATENT DOCUMENTS

| | | | |
|---|---|---|---|
| 2010/0309952 A1* | 12/2010 | Asami | G01R 23/20 |
| | | | 702/69 |
| 2013/0268819 A1* | 10/2013 | Chae | G01R 31/31715 |
| | | | 714/733 |
| 2017/0254844 A1* | 9/2017 | Sestok, IV | G01R 27/14 |
| 2018/0180652 A1* | 6/2018 | Sestok, IV | G01R 27/14 |

* cited by examiner

DEVICE UNDER TEST (DUT) MEASUREMENT CIRCUIT HAVING HARMONIC MINIMIZATION

CROSS-REFERENCE TO RELATED APPLICATIONS

This application claims priority to U.S. Provisional Application No. 63/153,508, filed Feb. 25, 2021, which is hereby incorporated by reference.

BACKGROUND

As new electronic devices are developed and integrated circuit (IC) technology advances, new IC products are commercialized. One example IC product for electronic devices is a microcontroller or measurement circuit configured to obtain measurements of a device under test (DUT), analyze the measurements to determine at least one parameter, and provide the parameter or related control signals to another circuit for DUT management operations.

Many electronic systems include a battery and a related monitoring circuit. In such systems, the battery is an example of a DUT and the monitoring circuit includes a microcontroller or measurement circuit configured to obtain voltage and current measurements related to the battery. The voltage and current measurements may be used to determine a parameter such as the impedance of the battery. The impedance of the battery and/or other parameters are used for battery management operations such as battery charging, battery status management, and/or battery health monitoring.

In a battery management system, when the microcontroller or measurement circuit obtains voltage and/or current samples related to the battery, related excitation and sampling operations can affect the signal-to-noise ratio (SNR) of the obtained samples at certain measurement frequencies. In some scenarios, the sampling operations introduce or do not properly manage harmonics and aliasing, which reduces accuracy of the obtained voltage and/or current samples and related parameters. Inaccurate parameters negatively affects the timing and/or accuracy of DUT management operations that rely on the parameters.

SUMMARY

In one example embodiment, a circuit for determining a parameter of a device under test (DUT) is described. The circuit comprises: a clock circuit configured to generate a reference clock signal; a driver circuit configured to generate an excitation signal at a target frequency having a period that is a first integer number of cycles of the reference clock signal, the excitation signal resulting in sense signals from the DUT; an update circuit configured to update the driver circuit at an update frequency having a period that is a second integer number of cycles of the reference clock signal; an analog-to-digital converter (ADC) configured to digitize the sense signals at a frequency having a period that is a third integer number of cycles of the reference clock signal to produce sense signal samples; a data selection circuit configured to identify a set of sense signal samples, the set having a fourth integer number of samples; and a control circuit configured to minimize harmonics at the target frequency of the excitation signal based on the first integer number, the second integer number, the third integer number, and the fourth integer number.

In another example embodiment, a system comprises a measurement circuit adapted to be coupled to a device under test (DUT). The measurement circuit includes: a transistor having a control terminal; a driver circuit coupled to the control terminal of the transistor and configured to provide an excitation signal having a target frequency to the control terminal; sense circuitry configured to obtain sense signals from the DUT, wherein the excitation signal determines a timing of the sense signals obtained from the DUT, wherein the sense circuitry includes an analog-to-digital converter (ADC) configured to digitize the sense signals to produce sense signal samples; and a control circuit coupled to the driver circuit and the sense circuitry, wherein the control circuit is configured to select sampling control parameters to minimize harmonics at the target frequency of the excitation signal; and a parameter estimator configured to estimate a parameter of the DUT based on the sense signal samples.

In yet another example embodiment, a method for device under test (DUT) management comprises: providing, by a measurement circuit, an excitation signal having a target frequency; controlling, by the measurement circuit, sampling control parameters to minimize harmonics at the target frequency; obtaining, by the measurement circuit, sense signal samples from sense signals related to the DUT responsive to the sampling control parameters and the excitation signal; estimating, by the measurement circuit, a parameter based on the sense signal samples; and performing DUT management operations based on the estimated parameter.

DETAILED DESCRIPTION

Some example embodiments include a measurement circuit related to device under test (DUT) management. The measurement circuit is configured to: provide an excitation signal having a target frequency; select sampling control parameters to minimize harmonics at the target frequency; obtain sense signal samples from sense signals related to the DUT responsive to the sampling control parameters and the excitation signal; and estimate a parameter based on the sense signal samples. The sample control parameters may vary depending on whether a pulse-width modulation (PWM) controller or digital-to-analog converter (DAC) is used to generate the excitation signal. The estimated parameter is used, for example, to adjust DUT management operations. As an example, the DUT may be a battery unit and the determined parameter is an impedance (e.g., impedance as a function of frequency) of the battery unit. In different example embodiments, the battery unit has a single battery cell or multiple battery cells (in series and/or in parallel). The impedance of the battery unit may be used to adjust battery management operations such as: battery-charging operations (turn battery unit or battery cell charging on/off); updating a battery unit or battery cell charge indicator status (e.g., 30%, 50%, 70%, 90%, etc.); identifying a battery unit or battery cell fault condition; and/or other battery management operations. In some example embodiments, the measurement circuit is configured to obtain the sense signals while minimizing harmonics to increase signal-to-noise ratio (SNR) of the obtained sense signals. In this manner, the accuracy of the determined parameter and related DUT management operations is increased.

Figure 1:
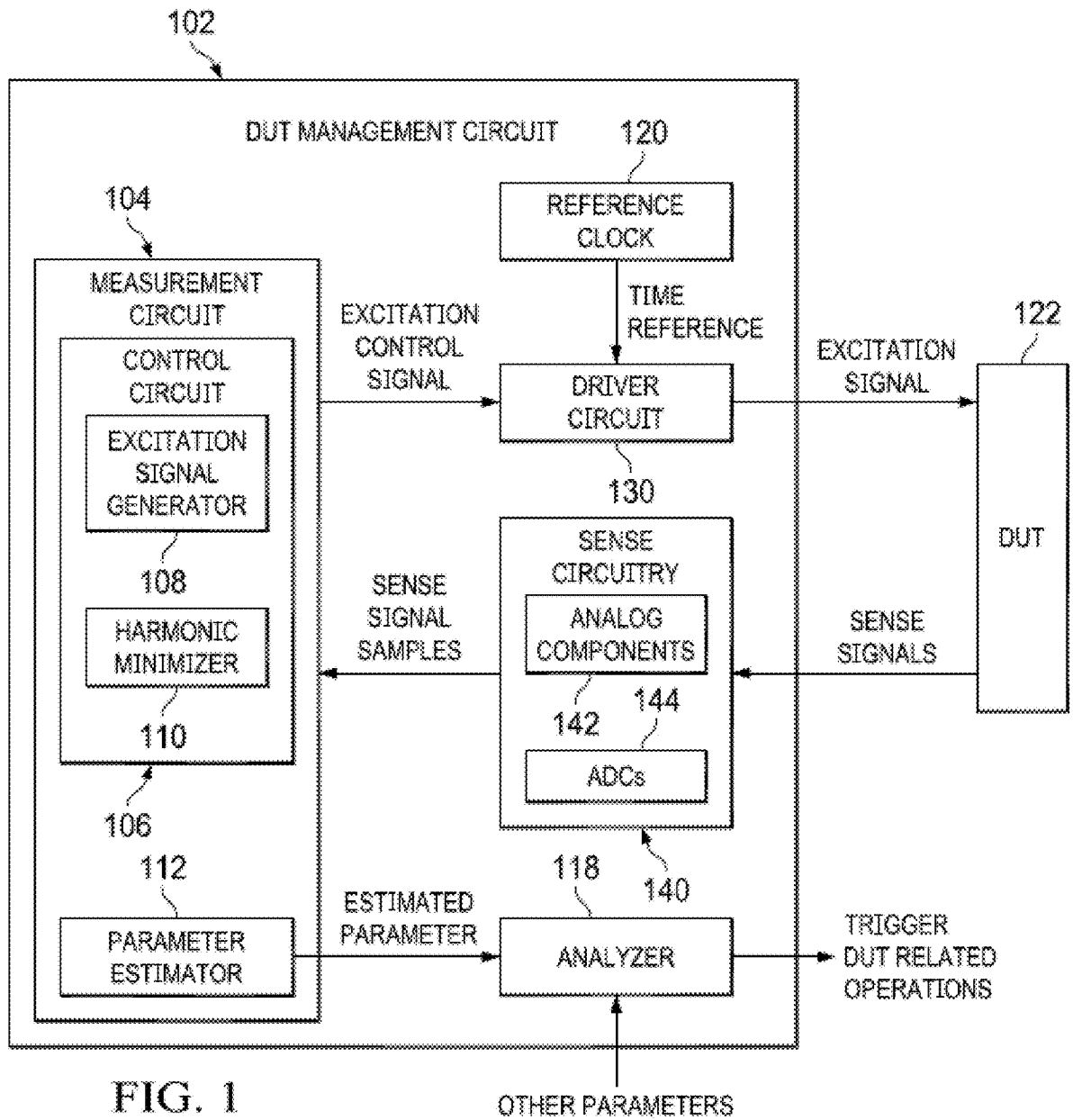
FIG. 1 is a block diagram of a system in accordance with an example embodiment.

The same reference numbers (or other reference designators) are used in the drawings to designate the same or similar (structurally and/or functionally) features. FIG. 1 is a block diagram of a system 100 in accordance with an example embodiment. The system 100 represents part of an electric vehicle, a desktop computer, a laptop computer, a smartphone, or other electrical system. As shown, the system 100 includes a DUT 122 coupled to a DUT management circuit 102. In some example embodiments, the DUT management circuit 102 is configured to: provide an excitation signal to the DUT 122; obtain sense signal samples based on the excitation signal and based on sampling control parameters that minimize harmonics at the target frequency of the excitation signal; and estimate a parameter based on the sense signal samples. In some example embodiments, the sense signal samples include voltage across the DUT 122 and the current through the DUT 122 (e.g., as a function of frequency). Without limitation, the DUT 122 may be a battery unit, which represents single battery cell, a group of battery cells called a battery module, or a group of battery modules.

In the example of FIG. 1, the DUT management circuit 102 includes a measurement circuit 104, which may include one or more ICs and/or discrete components. More specifically, the measurement circuit 104 includes a control circuit 106, a reference clock 120, a driver circuit 130, sense circuitry 140, and a parameter estimator 112. In some example embodiments, the driver circuit 130 generates an excitation signal based on: an excitation control signal from the control circuit 106; and a reference clock signal or time reference (e.g., $CLK_{REF}$ herein) from the reference clock 120. The excitation signal results in sense signals from the DUT 122. The sense circuitry 140 is configured to provide sense signal samples of the sense signals based on: the excitation signal from the driver circuit 130; and sampling control parameters provided by the harmonic minimizer 110 to minimize harmonics at the target frequency of the excitation signal. The sampling control parameters may vary depending on whether the driver circuit 130 uses a DAC or a PWM controller to generate the excitation signal.

In some example embodiments, the sense circuitry 140 includes analog components 142 and analog-to-digital converters (ADCs) 144 to generate sense signal samples based on the sense signals and sampling control parameters. Without limitation, the analog components 142 may include: sense resistors, amplifiers, and low-pass filters (LPFs) or anti-aliasing filters. In some example embodiments, the LPFs are configured to attenuate frequency content of the sense signals above half a sampling frequency of the ADCs 144.

The sense signal samples are provided to the parameter estimator 112, which estimates a parameter based on the sense signal samples. In some example embodiments, the parameter estimator 112 includes an impedance spectrometer. In such case, the parameter to be estimated is an impedance of the DUT 122 as a function of frequency (e.g., $Z(j\omega)=V(j\omega)/I(j\omega)$, where j is the unit imaginary number and w is the frequency in rad/sec). The impedance of the DUT 122 as a function of frequency may be estimated, for example, in the frequency domain based on sense signal samples of the voltage across the DUT 122 and sense signal samples of the current through the DUT 122.

In some example embodiments, the sampling control parameters provided by the harmonic minimizer 110 include: a target frequency or related first period for the excitation signal, the first period being a first integer number of cycles of $CLK_{REF}$; an update frequency for the driver circuit 130 or related second period, the second period being a second integer number of cycles of $CLK_{REF}$; a digitization frequency for the ADCs 144 or related third period, the third period being a third integer number of cycles of the reference clock signal; and a discrete Fourier transform (DFT) block size that is a fourth integer number of sense signal samples.

In some example embodiments, the driver circuit 130 includes a DAC to generate the excitation signal. In such case, harmonic minimization is based on the first integer number, the second integer number, the third integer number, and the fourth integer number. In other example embodiments, the driver circuit 130 includes a PWM controller to generate the excitation signal. In such case, harmonic minimization is based on the first integer number, the second integer number, the third integer number, the fourth integer number, and a fifth integer number. The fifth integer number is related to the excitation control signal or related fourth period, the fourth period being a fifth integer number of cycles of the reference clock signal. In some example embodiments, the first integer number is a function of the product of the third and fourth integer numbers divided by a frequency index of the excitation signal. In some example embodiments, the values for the first integer number, the second integer number, the third integer number, the fourth integer number, and/or the fifth integer number are selected by solving a linear congruence equation. The linear congruence equation may vary depending on whether a DAC or PWM controller is used. Examples of suitable linear congruence equations are provided later.

With the sampling control parameters, the SNR of the obtained sense signal samples is improved relative to conventional sampling techniques, resulting in higher accuracy for the estimated parameter determined by the parameter estimator 112. In the example of FIG. 1, the estimated parameter is provided to the analyzer circuit 118. In some example embodiments, the analyzer circuit 118 is a processor, application-specific integrated circuit (ASIC), or programmable logic configured to analyze the estimated parameter and possibly other parameters (e.g., temperature and/or other sensed parameters) to trigger DUT management operations. Example DUT management operations, when the DUT is a battery unit, include: adjusting battery-charging operations (turn battery unit or battery cell charging on/off); updating a battery unit or battery cell charge indicator status (e.g., 30%, 50%, 70%, 90%, etc.); identifying a battery unit or battery cell fault condition; and/or other battery management operations.

In some example embodiments, the DUT management circuit 102 is an integrated circuit (IC). In other example embodiments, the DUT management circuit 102 includes multiple ICs (packaged individually or together) and/or discrete components. As desired, the various components may be mounted to a printed circuit board (PCB). In one example, the control circuit 106 is in a first IC, while the reference clock 120, driver circuit 130 and sense circuitry 140 are in a second IC, and the analyzer circuit 118 is in a third IC. Other variations are possible.

Figure 2A:
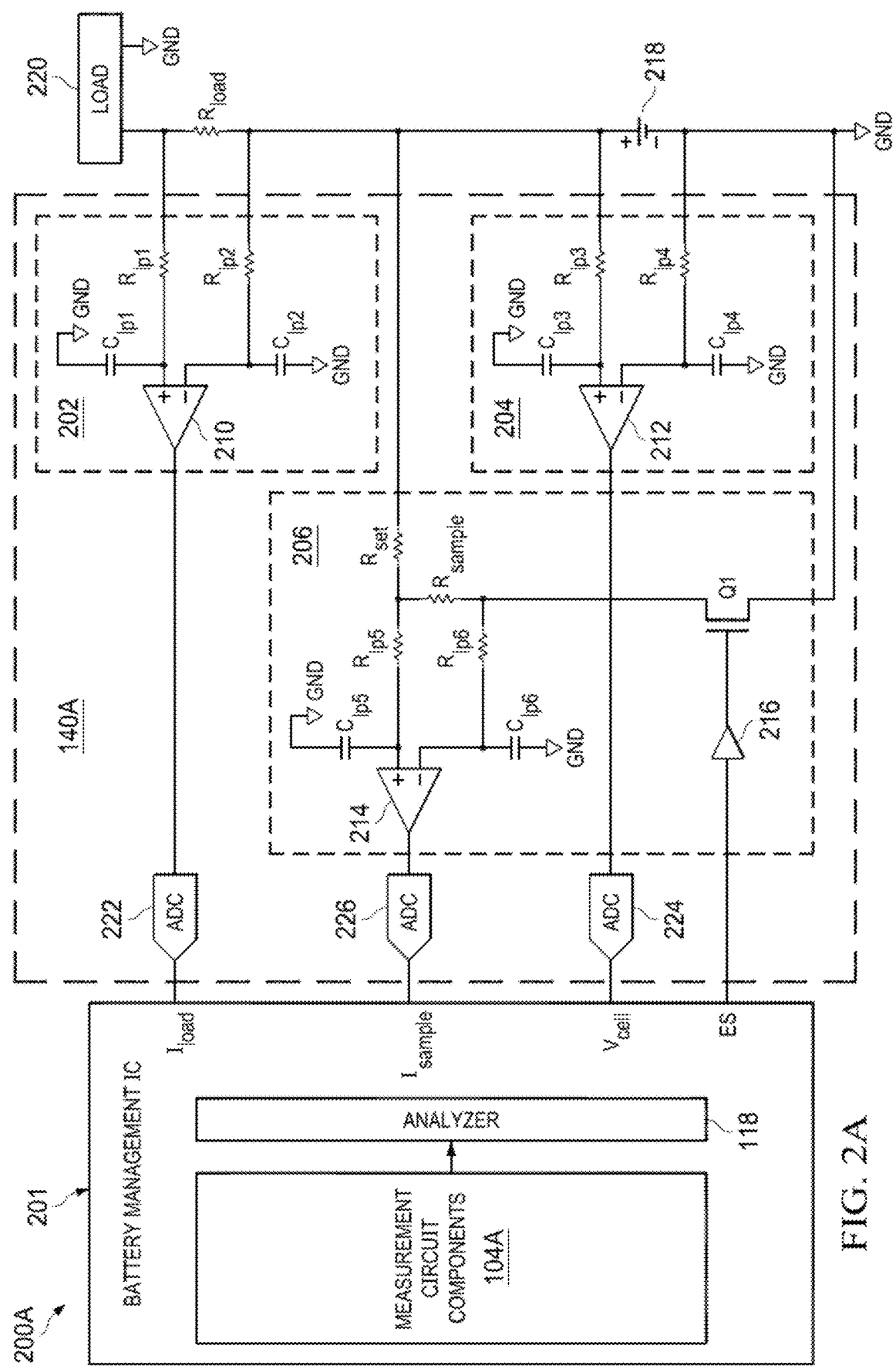
FIG. 2A is a diagram of a battery unit management system in accordance with an example embodiment.

FIG. 2A is a diagram of a battery unit management system 200A (an example of the system 100 in FIG. 1) in accordance with an example embodiment. The battery unit management system 200A includes a battery management IC 201 coupled to a battery unit 218 via sense circuitry 140A (an example of the sense circuitry 140 in FIG. 1). Together, the battery management IC 201 and the sense circuitry 140A are an example of the DUT management circuit 102 in FIG. 1. As shown, the battery management IC 201 includes measurement circuit components 104A (e.g., part of the measurement circuit 104 in FIG. 1) and the analyzer circuit 118. The measurement circuit components 104A include, for example, the control circuit 106, the reference clock 120, the driver circuit 130, and the parameter estimator 112 in FIG. 1. The sense circuitry 140A includes various analog path components and ADCs (e.g., examples of the analog components 142 and the ADCs 144 in FIG. 1) described in greater detail below.

As shown, a first side of the battery unit 218 is coupled to a load sense resistor ($R_{load}$) to measure the current supplied to a load 220. A second side of the battery unit 218 is coupled to ground. Over time, the battery unit 218 provides current to the load 220 at a given voltage while being monitored by the battery management IC 201 via the sense circuitry 140A. As the battery unit 218 provides current to the load 220 and/or as the battery unit 218 provides current to a set resistor ($R_{set}$) and a sample resistor ($R_{sample}$), the amount of available energy stored by the battery unit 218 decreases. The battery unit 218 may also experience variations in temperature and/or performance over time. In the example of FIG. 2A, the battery management IC 201 obtains sense signal samples related to the battery unit 218 based on: application of an excitation signal (ES); and sampling control parameters. The analyzer circuit 118 is configured to estimate a parameter based on sense signal samples obtained by the measurement circuit 104.

More specifically, in the example of FIG. 2A, the battery management IC 201 also includes a load current ($I_{load}$) input, a sample current ($I_{sample}$) input, battery unit voltage ($V_{cell}$) input, and an ES output coupled to a sense circuitry 140A. In the description, $V_{cell}$ suggests the battery unit voltage is for a single battery cell. However, it should be appreciated that the battery unit voltage could be for multiple battery cells in some example embodiments. As shown, the sense circuitry 140A includes a first sense circuit 202 configured to provide an $I_{load}$ sense signal responsive to the excitation signal applied to the battery unit 218. In the example of FIG. 2A, the $I_{load}$ sense signal is digitized by an ADC 222 such that the battery management IC 201 receives $I_{load}$ samples at the $I_{load}$ input. The $I_{load}$ samples indicate the current through $R_{load}$. In some example embodiments, the first sense circuit 202 includes a first operational amplifier 210 having an non-inverting (+) input, an inverting (−) input, and an output. The non-inverting input of the first operational amplifier 210 is coupled to a first side of $R_{load}$ via a first resistor (Ripe). The non-inverting input of the first operational amplifier 210 is also coupled to the first side of a first capacitor ($C_{Ip1}$). The second side of $C_{Ip1}$ is coupled to ground. Together $R_{Ip1}$ and $C_{Ip1}$ form a first low-pass filter. The inverting input of the first operational amplifier 210 is coupled to a second side of $R_{load}$ via a second resistor ($R_{Ip2}$). The inverting input of the first operational amplifier 210 is also coupled to the first side of a second capacitor ($C_{Ip2}$). The second side of $C_{Ip2}$ is coupled to ground. Together $R_{Ip2}$ and $C_{Ip2}$ form a second low-pass filter. The output of the first operational amplifier 210 is coupled to the $I_{load}$ input of the battery management IC 201 via the ADC 222.

The sense circuitry 140A also includes a second sense circuit 204 configured to provide a $V_{cell}$ sense signal responsive to the excitation signal applied to the battery unit 218. In the example of FIG. 2A, the $V_{cell}$ sense signal is digitized by an ADC 224 such that the battery management IC 201 receives $V_{cell}$ samples at the $V_{cell}$ input. The $V_{cell}$ samples indicate the voltage across the battery unit 218. In some example embodiments, the second sense circuit 204 includes a second operational amplifier 212 having an non-inverting (+) input, an inverting (−) input, and an output. The non-inverting input of the second operational amplifier 212 is coupled to a first side of the battery unit 218 via a third resistor ($R_{Ip3}$). The non-inverting input of the second operational amplifier 212 is also coupled to the first side of a third capacitor ($C_{Ip3}$). The second side of $C_{Ip3}$ is coupled to ground. Together $R_{Ip3}$ and $C_{Ip3}$ form a third low-pass filter. The inverting input of the second operational amplifier 212 is coupled to a second side of the battery unit 218 via a fourth resistor ($R_{Ip4}$). The inverting input of the second operational amplifier 212 is also coupled to the first side of a fourth capacitor ($C_{Ip4}$). The second side of $C_{Ip4}$ is coupled to ground. Together $R_{Ip4}$ and $C_{Ip4}$ form a fourth low-pass filter. The output of the second operational amplifier 212 is coupled to the $V_{cell}$ input of the battery management IC 201 via the ADC 224.

The sense circuitry 140A further includes a third sense circuit 206 configured to provide an $I_{sample}$ sense signal responsive to the excitation signal applied to the battery unit 218. In the example of FIG. 2A, the $I_{sample}$ sense signal is digitized by an ADC 226 such that the battery management IC 201 receives $I_{sample}$ samples at the $I_{sample}$ input. The $I_{sample}$ samples indicate part of the current through the battery unit 218 (i.e., the combination of $I_{sample}$ and $I_{load}$ indicate the current through the battery unit 218). In some example embodiments, the third sense circuit 206 includes a third operational amplifier 214 having an non-inverting (+) input, an inverting (−) input, and an output. The non-inverting input of the third operational amplifier 214 is coupled to a first side of the battery unit 218 via a fifth resistor ($R_{Ip5}$). The non-inverting input of the second operational amplifier 212 is also coupled to the first side of a fifth capacitor ($C_{Ip5}$). The second side of $C_{Ip5}$ is coupled to ground. Together $R_{Ip5}$ and $C_{Ip5}$ form a fifth low-pass filter. The inverting input of the third operational amplifier 214 is coupled to a second side of the battery unit 218 via a sixth resistor ($R_{Ip6}$) and a switch (Q1).

As shown, Q1 includes a control terminal, a first current terminal, and a second current terminal. The control terminal of Q1 is coupled to the ES output of the battery management IC 201 via a buffer 216. The first current terminal of Q1 is coupled to the inverting input of the third operational amplifier 214 via $R_{Ip6}$. The first current terminal of Q1 is also coupled to the first side of the battery unit 218 via $R_{sample}$. The second current terminal of Q1 is coupled to ground. The inverting input of the third operational amplifier 214 is also coupled to the first side of a sixth capacitor ($C_{Ip6}$). The second side of $C_{Ip6}$ is coupled to ground. Together $R_{Ip6}$ and $C_{Ip6}$ form a sixth low-pass filter. The output of the third operational amplifier 214 is coupled to the $I_{sample}$ input of the battery management IC 201 via the ADC 226.

The low-pass filters (e.g., the first low-pass filter through the sixth low-pass filter) in FIG. 2A are examples of first-order filters. In other example embodiments, the filter order can be increased in order to improve the signal quality of the voltage and current measurement circuits. In other example embodiments, the filter design can have a differential configuration, where a capacitor is placed between the two input signal paths. Regardless of the particular topology, the low-pass filters of the sense circuitry 140A are configured to perform an anti-aliasing function by attenuating frequency content of the sense signals above half a sampling frequency of the ADCs 222, 224, and 226.

With the battery management IC 201, the sampling control parameters are controlled by the measurement circuit components 104A. In some example embodiments, the measurement circuit components 104A are configured to: generate an excitation signal at a target frequency having a period that is a first integer number of cycles of the reference clock signal; update the driver circuit at an update frequency having a period that is a second integer number of cycles of the reference clock signal; digitize sense signals resulting from the excitation signal at a frequency having a period that is a third integer number of cycles of the reference clock signal; identify a fourth integer number of sense signal samples (the DFT block size); and minimize harmonics at the target frequency of the excitation signal based on the first integer number, the second integer number, the third integer number, and the fourth integer number. When a PWM controller is used to generate the excitation signal, harmonic minimization may also be based on a fifth integer number. In such embodiments, an excitation control signal may be used to generate the excitation signal, where the excitation control signal has a frequency with a period that is a fifth integer number of cycles of the reference clock signal. In some example embodiments, the first integer number is a function of the product of the third and fourth integer numbers divided by a frequency index (i.e., a DFT bin) of the excitation signal.

Based on the sampling operations and parameter estimation operations performed by the battery management IC 201, battery management operations may be performed. Example battery management operations include: adjusting a recharge process of the battery unit 218 or related battery cells; tracking/storing/displaying a charge status of the battery unit 218 or related battery cells; tracking/storing/displaying a health status of the battery unit 218 or related battery cells; and/or other operations.

With the battery unit management system 200A, obtaining current and voltage samples related to one battery unit 218 is performed. It should be appreciated that the battery unit 218 may include one or more physical battery cells connected in series and/or in parallel. The number of cells included in the battery unit 218 may vary. As needed, additional battery management ICs (like the battery management IC 201) and additional sense circuitry (like the sense circuitry 140A) are used to perform sampling and parameter estimation operations as described herein for a battery unit or related battery cells.

There are several scenarios in which current can flow in and out of the battery unit 218. A first scenario is when discharging the battery unit 218, which occurs when a load demands power from the battery unit 218. A second scenario is when charging the battery unit 218. A third scenario is when operating a switch connected in parallel with the battery unit 218. In FIG. 2A, Q1 is a field-effect transistor (FET) coupled in parallel with the battery unit 218. Each time Q1 is closed, a small amount of current is extracted from the battery unit 218. Because the battery unit 218 is used as a current source to generate the measurement signal (e.g., a galvanostatic measurement), the maximum current value is determined by the maximum voltage of the battery unit 218 and the total resistance ($R_T$) of the current loop. $R_T$ may be given as:

$$R_T = R_{sample} + R_{FET} + R_{trace} + R_{set}, \quad \text{Equation (1)}$$

where $R_{FET}$ is the resistance of Q1, $R_{trace}$ is the resistance of the board traces, and $R_{set}$ is a resistor that regulates the maximum current level through the switched path, and $R_{sample}$ can be used to adjust the measurement voltage level to achieve full scale range of the third operational amplifier 214. In some example embodiments, the on/off duration and on/off switching frequency of Q1 is controlled using a PWM controller or PWM waveform generator (note: herein "waveform" and "signal" are used interchangeably) that is able to generate different current waveforms through $R_{sample}$. By measuring the load current, $I_{load}$, and the sample current, $I_{sample}$, the current through the battery unit 218 can be computed as follows:

$$I_{cell}[n] = -(I_{load}[n] + I_{sample}[n]), \quad \text{Equation (2)}$$

where the value n denotes the discrete time sample of the respective waveform. With Equation 2, a positive battery current is denoted by current flowing into the battery unit 218. Once the current through the battery unit 218 is known, the voltage across the battery unit 218, $V_{cell}[n]$, can be measured using the second operational amplifier 212. Once the voltage of the battery unit 218 and the current through the battery unit 218 is known, the impedance of the battery unit 218 can be computed as follows:

$$Z_{cell}(j\Omega) = \frac{V_{cell}(j\Omega)}{I_{cell}(\Omega)}, \quad \text{Equation (3)}$$

where $V_{cell}(j\Omega)$ is the Fourier transform of the continuous time signal $V_{cell}(j\Omega)$, $I_{cell}(j\Omega)$ is the Fourier transform of the continuous time signal $I_{cell}(j\Omega)$, and $\Omega$ is the frequency in units of rad/sec.

Typically, battery monitoring applications only need to evaluate the Fourier transform for approximately 30 to 50 frequencies over a frequency range of 1 mHz to 10 kHz to get a representative impedance estimate. The resulting representation for the impedance of the logical cell at the kth frequency is given as:

$$Z_{cell}(j\Omega_k) = \frac{V_{cell}(j\Omega_k)}{I_{cell}(j\Omega_k)} \quad \text{Equation (4)}$$

In some example embodiments, Q1 can be used to create a sinusoidal input signal by controlling the on/off duration and on/off switching frequency with a PWM controller. A continuous time sinusoid at frequency, $\omega_k$, in units of rad/sec, can be represented by the following equation:

$$s_k(t) = A_k \cdot \cos(\omega_k \cdot t). \quad \text{Equation (5)}$$

where $A_k$ is the amplitude of the sinusoid and t is time. For more information regarding the harmonic content of the signal coming from a PWM controller, reference may be had to the measurement circuit 600 of FIG. 6 and the measurement circuit 700 of FIG. 7 and related signal paths.

Figure 2B:
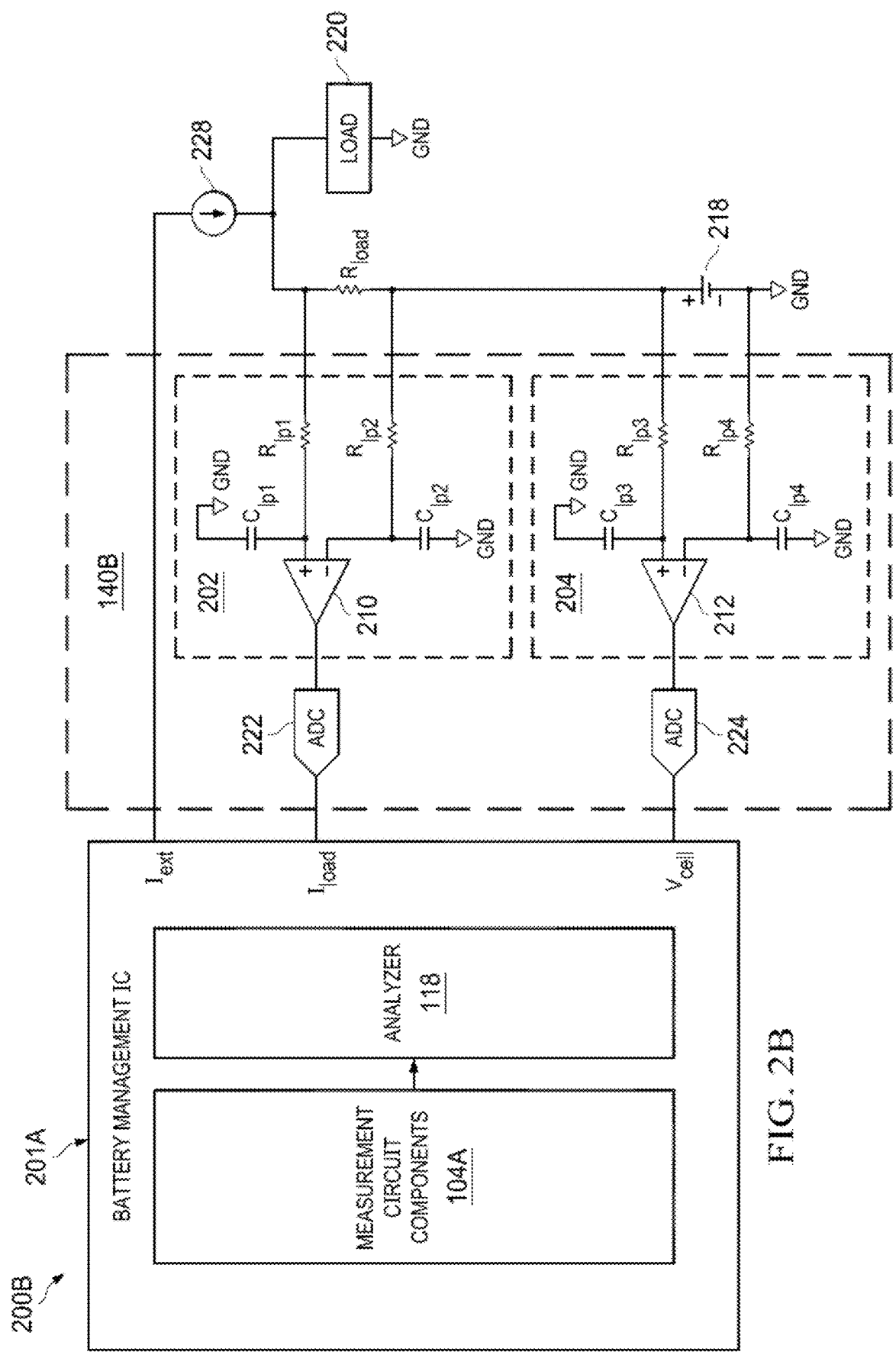
FIG. 2B is a diagram of a battery unit management system in accordance with another example embodiment.

FIG. 2B is a diagram of a battery unit management system 200B (an example of the system 100 in FIG. 1) in accordance with another example embodiment. The battery unit management system 200B includes a battery management IC 201A (e.g., a variation of the battery management IC 201) coupled to the battery unit 218 via sense circuitry 140B (an example of the sense circuitry 140 in FIG. 1). Together, the battery management IC 201A and the sense circuitry 140B are an example of the DUT management circuit 102 in FIG. 1.

Relative to the battery unit management system 200A in FIG. 2A, the battery unit management system 200B in FIG. 2B has many of the same components (e.g., $R_{load}$, the measurement circuit components 104A, the analyzer circuit 118, the first sense circuit 202 and related components, the second sense circuit 204 and related components, the ADC 222, and the ADC 224), but an external source 228 is used to generate the desired excitation signal with the harmonic content needed for impedance measurements. The external source 228 may be a current source, a field-effect transistor (FET), a bipolar transistor, or a portion of the load. In the battery unit management system 200B, the battery management IC 201A is configured to provide an excitation control signal ($I_{ext}$) at an $I_{ext}$ output to the external current source 228. In response to the excitation control signal, the external current source 228 provides an excitation signal to the load 220. As in the battery unit management system 200A in FIG. 2A, the battery unit management system 200B obtains $I_{load}$ samples and $V_{cell}$ samples based on the excitation signal and sampling control parameters. The $I_{load}$ samples and $V_{cell}$ samples are used to estimate an impedance of the battery unit 218. With sampling that accounts for harmonic minimization as described herein, the battery management IC 201A is able to improve accuracy of the impedance estimate and related battery management operations.

Figure 3:
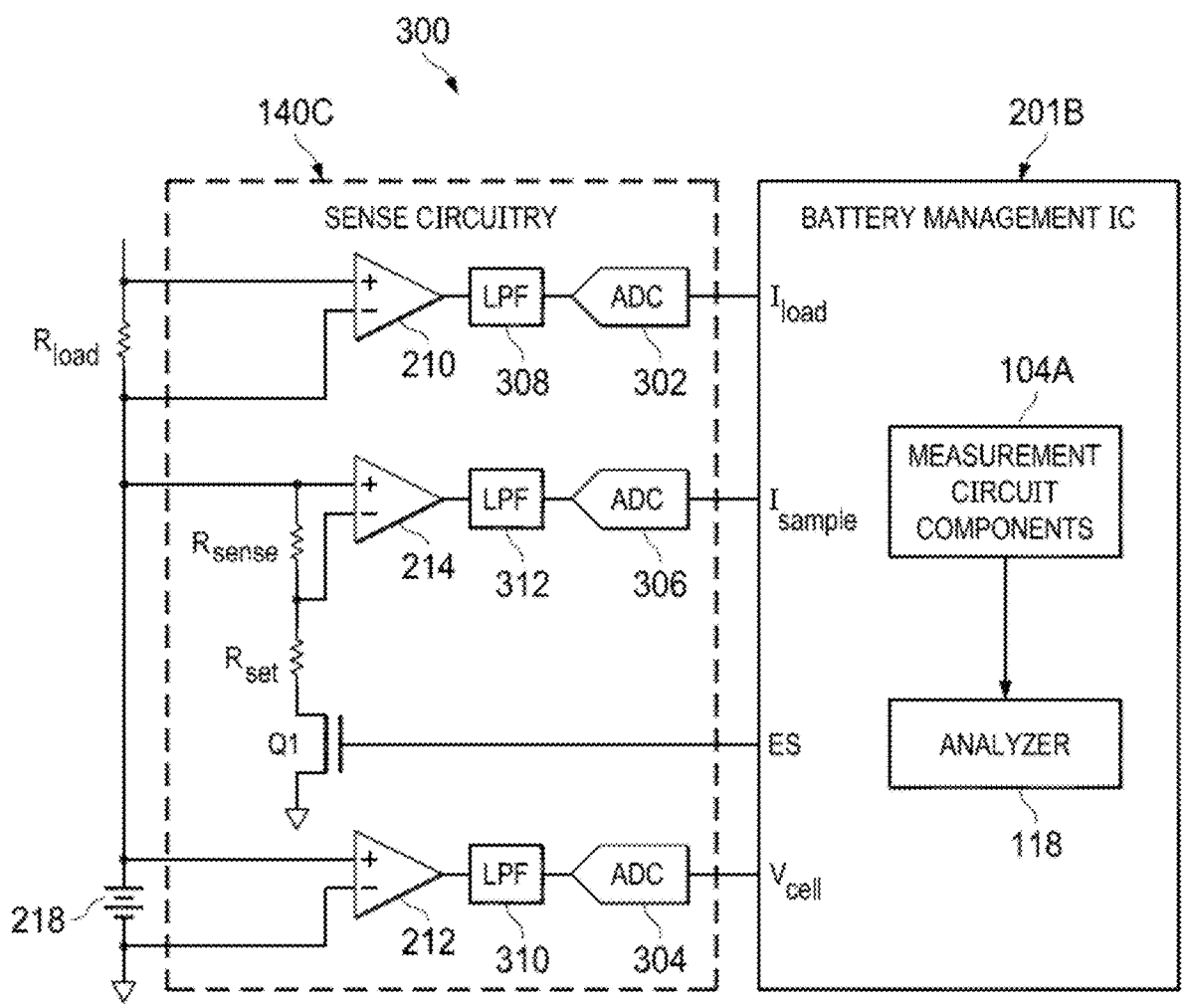
FIG. 3 is a diagram of a battery unit management system in accordance with yet another example embodiment.

FIG. 3 is a diagram of a battery unit management system 300 in accordance with yet another example embodiment. The battery unit management system 300 includes a battery management IC 201B (e.g., a variation of the battery management IC 201 in FIG. 2A) coupled to the battery unit 218 via sense circuitry 140C (an example of the sense circuitry 140 in FIG. 1). Together, the battery management IC 201B and the sense circuitry 140C are an example of the DUT management circuit 102 in FIG. 1.

In the example of FIG. 3, the sense circuitry 140C includes many of the same components described for the sense circuit 140A in FIG. 2A. As shown, the sense circuitry 140C includes the first operational amplifier 210, the second operational amplifier 212, and the third operational amplifier 214 described in FIG. 2A. The non-inverting input of the first operational amplifier 210 is coupled to the first side of $R_{load}$. The inverting input of the first operational amplifier 210 is coupled to the second side of $R_{load}$. The output of the first operational amplifier 210 is coupled to an input of the first ADC 302 via a low-pass filter (LPF) 308. The output of the first ADC 302 is a digitized value for $I_{load}$ and is provided to the $I_{load}$ input of the battery management IC 201B. The non-inverting input of the second operational amplifier 212 is coupled to the first side of the battery unit 218. The inverting input of second operational amplifier 212 is coupled to the second side of the battery unit 218. The output of the second operational amplifier 212 is coupled to an input of the second ADC 304 via LPF 310. The LPFs 308, 310, and 312 in FIG. 3 may have first-order filter arrangements such as those described for the first, second, and third sense circuits 202, 204, and 206 of FIG. 2A, or may have another filter arrangement. The output of the second ADC 304 is a digitized value for $V_{cell}$ and is provided to the $V_{cell}$ input of the battery management IC 201B. The non-inverting input of the third operational amplifier 214 is coupled to the first side of the battery unit 218. The inverting input of the third operational amplifier 214 is coupled to ground (the second side of the battery unit 218) via Q1. In the example of FIG. 3, a voltage divider having two resistors ($R_{sense}$ and $R_{set}$) is used to scale the voltage across the inputs of the third operational amplifier 214. More specifically, $R_{sense}$ is coupled across the inputs of the third operational amplifier 214 and $R_{set}$ is between the inverting input of the operational amplifier 214 and a first current terminal of Q1. The output of the third operational amplifier 214 is coupled to an input of the third ADC 306 via LPF 312. The output of the third ADC 306 is a digitized value for $I_{sample}$ and is provided to the $I_{sample}$ input of the battery management IC 201B.

With the battery unit management system 300, $I_{load}$, $I_{sample}$, and $V_{cell}$ samples are obtained based on application of an excitation signal and based on sampling control parameters as described herein. In different example embodiments, the ADCs (e.g., the ADCs 302, 304, 306) of the sense circuitry 140C may be internal or external to the battery management IC 201B. In either case, harmonic minimization operations are performed as described herein to improve the SNR of $I_{sample}$, $V_{cell}$, and/or $I_{load}$ and thus improve the accuracy of estimated parameters and related battery management operations.

Figure 4:
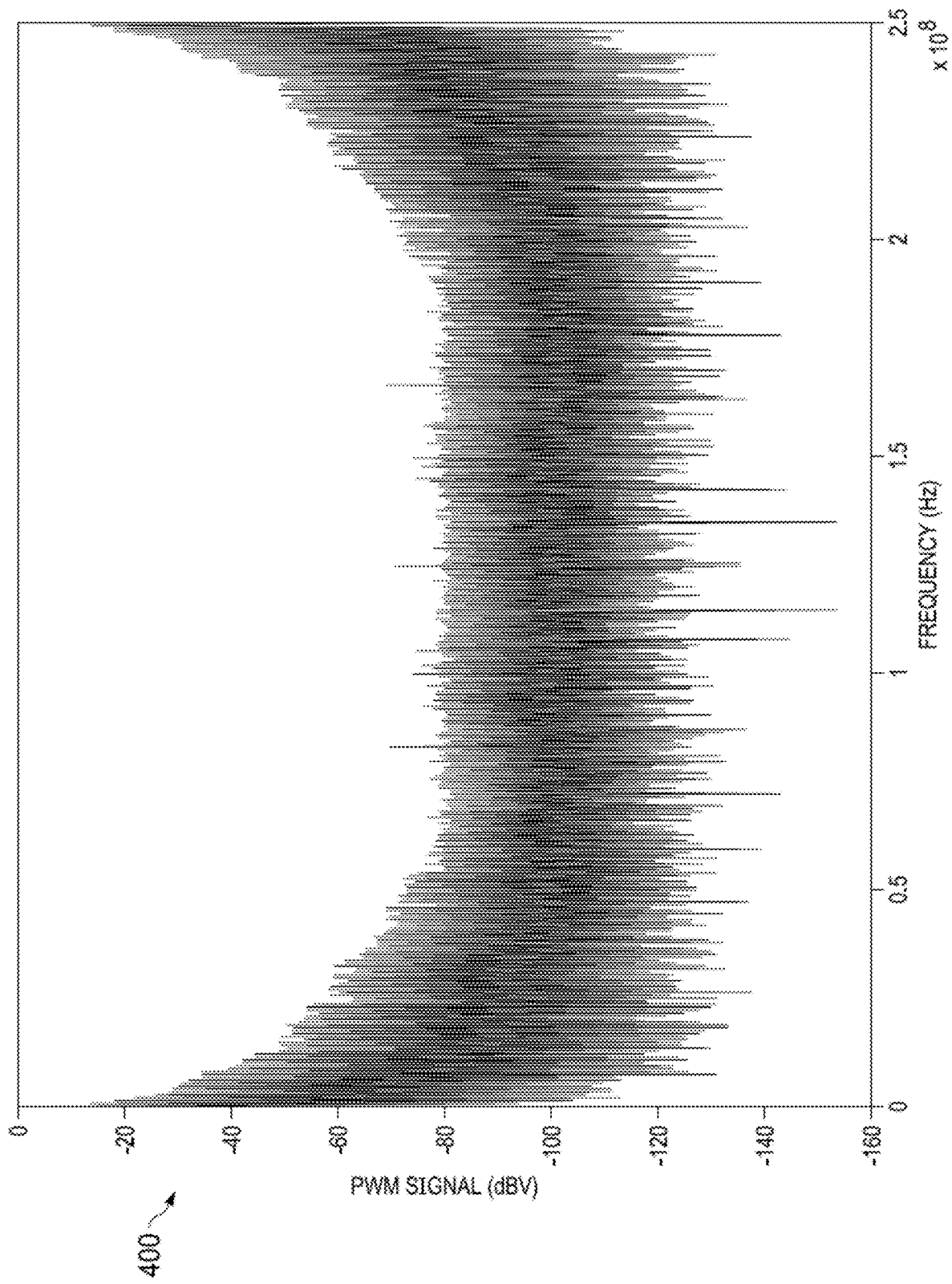
FIGS. 4 and 5 are graphs of pulse-width modulation (PWM) signal magnitude as a function of frequency showing distortion related to PWM signals.
Figure 5:
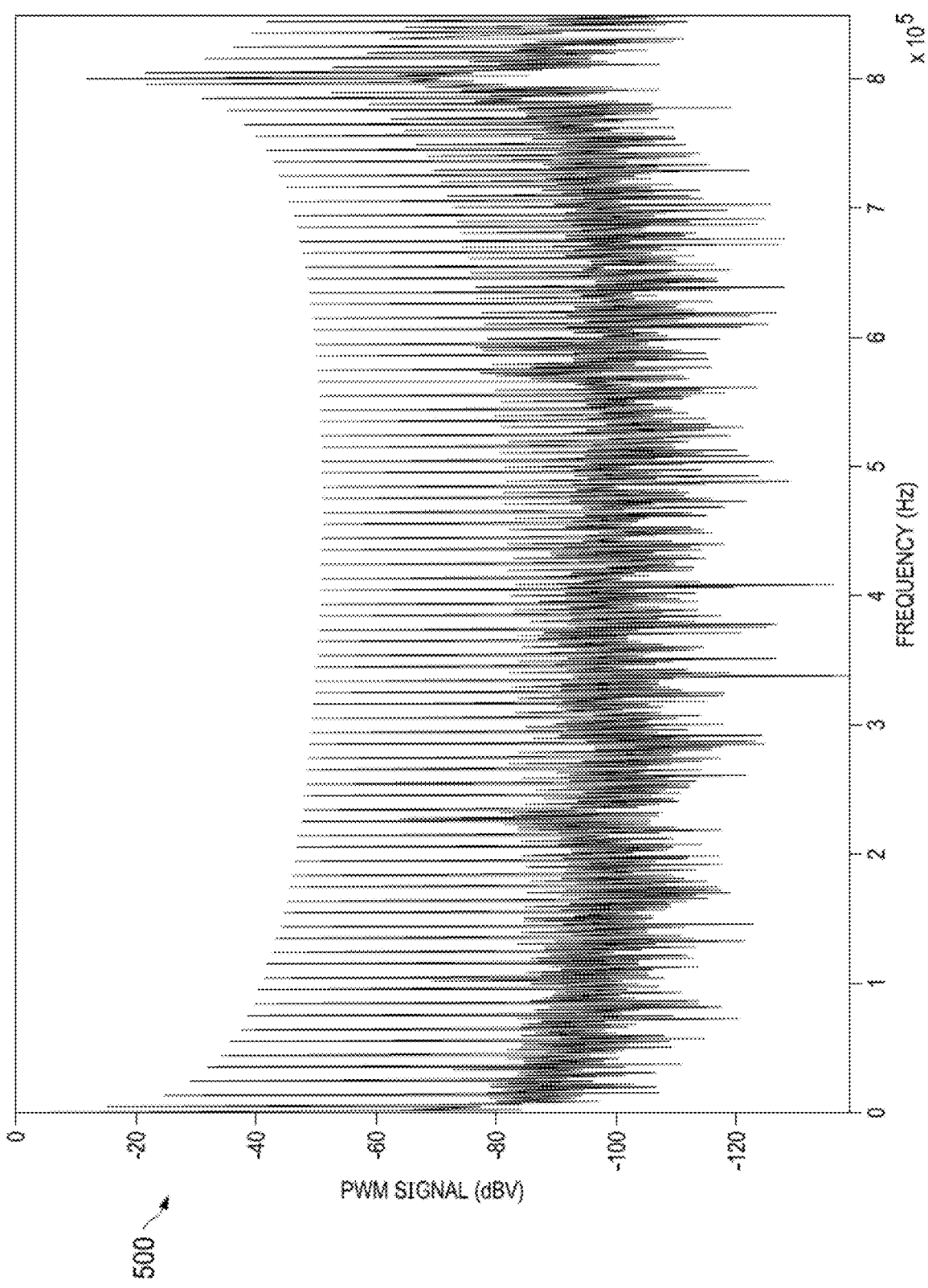
Figure 6:
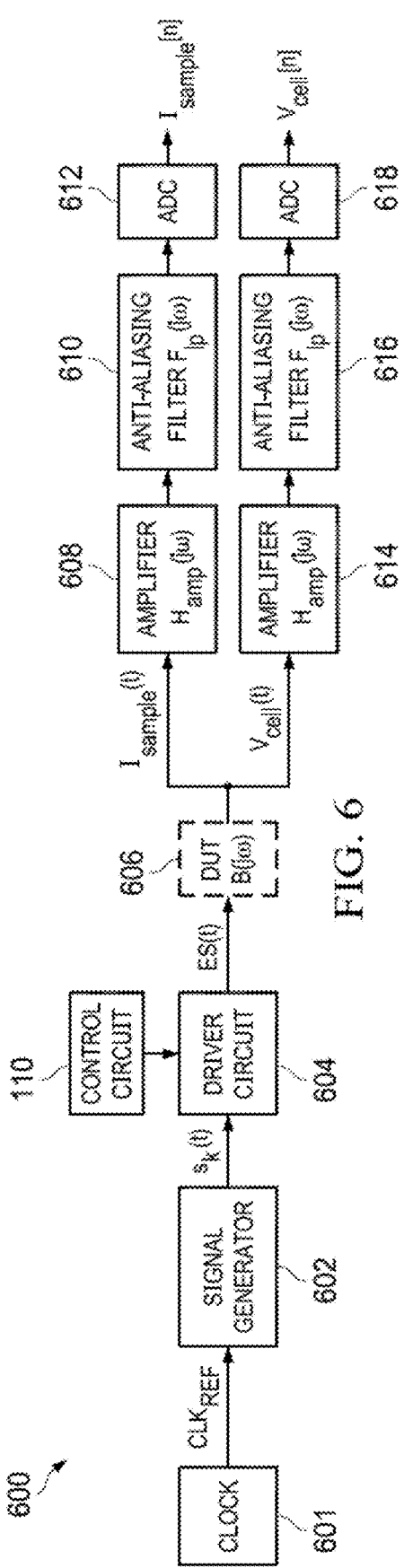
FIG. 6 is a block diagram of a measurement circuit for a battery unit in accordance with an example embodiment.

FIGS. 4 and 5 are graphs 400 and 500 of PWM signal magnitude as a function of frequency showing distortion related to PWM signals. In the graphs 400 and 500, the PWM signal contains significant distortion components (harmonics from and intermodulation between the excitation signal, PWM frequency, and duty cycle update rate). If ES is based on PWM signaling, the sampled voltage and current signals are vulnerable to aliasing from distortion components. Without careful sampling control parameter selection, interference from aliased components limits impedance measurement accuracy FIG. 6 is a block diagram of a measurement circuit 600 (e.g., at least part of the measurement circuit 104 in FIG. 1, at least some of the measurement circuit components 104A in FIG. 2A, 2B, or 3, and/or at least part of the sense circuitry 140, 140A, 140B, or 140C in FIG. 1, 2A, 2B, or 3) for a DUT 606 (e.g., the battery unit 218 in FIG. 2A, 2B, or 3) in accordance with an example embodiment. The measurement circuit 600 includes various analog path components (examples of the analog components 142 in FIG. 1) as well as ADCs 612 and 618 (examples of the ADCs 144 in FIG. 1) configured to obtain sense signal samples (e.g., $I_{sample}[n]$ and $V_{cell}[n]$) based on application of an excitation signal to the DUT 606 (an example of the DUT 122 in FIG. 1, or the battery unit 218 in FIG. 2A, 2B, or 3) and sampling control parameters.

As shown, the measurement circuit 600 includes a clock 601 configured to provide a $CLK_{REF}$. In some example embodiments, the clock 601 is coupled to a signal generator 602 configured to generate an excitation control signal $s_k(t)$. In some example embodiments, $s_k(t)$ has a frequency with a period that is a fifth integer number of cycles of the reference clock. A driver circuit 604 (an example of the driver circuit 130 in FIG. 1) is configured to receive and use $s_k(t)$ to generate an excitation signal ES(t) at a target frequency having a period that is the first integer number of cycles of $CLK_{REF}$. ES(t) is applied to a transistor (e.g., Q1 in FIGS. 2A and 3, or part of the external source 228 in FIG. 2B) and results in sense signal samples, $I_{sample}(t)$ and $V_{cell}(t)$, as a function of time from the DUT 606. In some example embodiments, the driver circuit 604 uses a PWM controller to generate ES(t), where the excitation control signal has a frequency with a period that is a fifth integer number of cycles of $CLK_{REF}$. In other example embodiments, the driver circuit 604 uses a DAC to generate ES(t). When a DAC is used, the excitation control signal is a digital control code and does not involve the fifth integer number. In the example of FIG. 6, the DUT 606 has the characteristics B(jω), where B is the battery frequency response, j is the unit imaginary number, and ω is the frequency in units of rad/sec.

The resulting current samples, $I_{sample}(t)$, and battery unit voltage, $V_{cell}(t)$, are measured with respective sense paths. Each sense path includes: a respective amplifier (e.g., amplifiers 608 and 614) having a frequency response given by $H_{amp}(j\omega)$; a respective anti-aliasing filter (e.g., the anti-aliasing filters 610 and 616) having a frequency response given by $F_{ip}(j\omega)$; and an analog-to-digital (ADC) converter (e.g., the ADCs 612 and 618).

In some example embodiments, an update circuit configured to update the driver circuit 604 at an update frequency having a period that is a third integer number of cycles of $CLK_{REF}$. Also, the ADCs 612 and 618 are configured to digitize the sense signals at a frequency having a period that is a fourth integer number of cycles of $CLK_{REF}$ to produce a number of sense signal samples ($I_{sample}[n]$ and $V_{cell}[n]$). In some example embodiments, the anti-aliasing filters 610 and 616 (e.g., LPF circuitry in FIG. 2A, 2B, or 3) receive the outputs from the respective amplifiers 608 and 614, where the anti-aliasing filters 610 and 616 are configured to attenuate frequency content of the sense signals above half a sampling frequency of the ADCs 612 and 618. In some example embodiments, obtaining $I_{sample}[n]$ and $V_{cell}[n]$ using the measurement circuit 600 is based on sampling control parameters (e.g., the first integer number, the second integer number, the third integer number, the fourth integer number, the fifth integer number, related periods, and/or frequencies) to minimize harmonics. The sampling control parameters to minimize harmonics vary depending on whether the driver circuit 604 uses a PWM controller (see e.g., FIG. 7) or a DAC (see e.g., FIG. 13).

Figure 7:
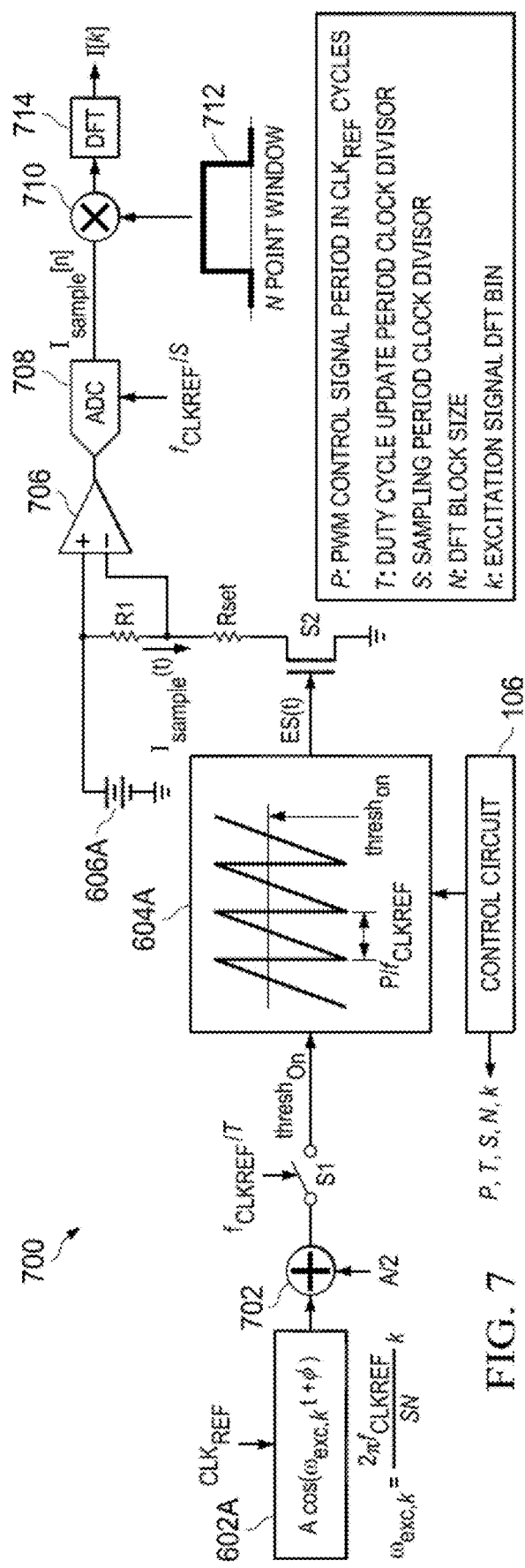
FIG. 7 is a diagram of a measurement circuit for a battery unit in accordance with another example embodiment.

FIG. 7 is a diagram of a measurement circuit 700 (e.g., at least part of the measurement circuit 104 in FIG. 1, at least some of the measurement circuit components 104A in FIG. 2A, 2B, or 3, and/or at least part of the sense circuitry 140, 140A, 140B, or 140C in FIG. 1, 2A, 2B, or 3) for a battery unit 606A (an example of the DUT 122 in FIG. 1, the battery unit 218 in FIG. 2A, 2B, and 3, or the DUT 606 in FIG. 6) in accordance with another example embodiment. The measurement circuit 700 includes analog path components (examples of the analog components 142 in FIG. 1) and an ADC 708. The measurement circuit 700 also includes DFT components (e.g., the multiplier 710, an N point window selector 712, and a DFT circuit 714.

As shown, the measurement circuit 700 includes a signal generator 602A (an example of the signal generator 602 in FIG. 6). The signal generator 602A is configured to receive $REF_{CLK}$ and generate a reference signal $A\cos(\omega_{exc,k}t+\phi)$, where $$\omega_{exc,k} = \frac{2\pi f_{CLKref}}{SN}k$$

is the angular frequency in units of rad/sec, A is an amplitude of the signal, ϕ is a phase, t is the time in units of sec, $f_{CLKref}$ is the frequency of $CLK_{REF}$ in units of Hz, S is the sampling period clock divisor, N is the DFT block size used by the DFT circuit 714, and k is the excitation signal DFT bin. The output of the signal generator 602A is provided to a combine circuit 702, which adds a signal A/2 to the reference signal. The output of the combine circuit 702 is provided to a driver circuit 604A via a switch (S1), which is operated at a rate of $f_{CLKREF}/T$, where T is duty cycle update period clock divisor. When turned on, S1 provides a threshold on ($thresh_{on}$) signal to the driver circuit 604A. In the example of FIG. 7, the driver circuit 604A uses a PWM controller to generate ES(t), which controls a switch S2 (e.g., Q1 in FIGS. 2A and 3). With a PWM controller, the duty cycle of ES(t) is a function of $P/f_{CLKREF}$ and a threshold, where P is the period used by the driver circuit 604A and the threshold is adjustable. When the PWM waveform used by the driver circuit 604A has a value above the threshold, ES(t) is high. When the PWM waveform used by the driver circuit 604A has a value below the threshold, ES(t) is low.

In the example of FIG. 7, ES(t) is provided to the control terminal of S2 (an example of Q1 in FIGS. 2 and 3). When S2 is turned on, the current flowing through the battery unit 606A (i.e., $I_{sample}(t)$) also flows through a sense resistor (R1) coupled between inputs of an operational amplifier 706 (an example of the third operational amplifier 214 in FIGS. 2 and 3). As shown, another resistor ($R_{set}$) is between the inverting input of the operational amplifier 706 (an example of the third operational amplifier 214 in FIGS. 2A and 3, or amplifier 608 in FIG. 6) and a first current terminal of S2. The second current terminal of S2 is coupled to ground. The operational amplifier 706 amplifies $I_{sample}(t)$, and the amplified $I_{sample}(t)$ is provided to an ADC 708 (an example of the ADC 226 in FIG. 2A, the ADC 306 in FIG. 3, or the ADC 612 in FIG. 6). As shown, the ADC 708 is operated at a frequency of $f_{CLKREF}/S$, where S is the sampling period clock divisor. The output of the ADC 708 is provided to a multiplier 710, which multiplies the output of the ADC 708 by an N point window 712. The output of the multiplier 710 is provided to the DFT circuit 714, which provides frequency domain values $I_{sample}[k]$ related to $I_{sample}(t)$. As desired, the measurement circuit 700 includes additional components to obtain frequency domain values (e.g., $V_{cell}[k]$ and/or $I_{load}[k]$) from other sense signals.

In the example of FIG. 7, the measurement circuit 700 is configured to generate a reference signal ($A\cos(\omega_{exc,k}t+\phi)$); and use the reference signal to generate an excitation signal ES(t) at a target frequency having a period that is the first integer number (e.g., S*N/k in FIG. 7) of cycles of the reference clock signal. In some example embodiments, a PWM controller uses a frequency having a period that is a fifth integer number (e.g., P in FIG. 7) of cycles of the reference clock signal to generate the excitation signal. The excitation signal results in sense signals related to the battery unit 606A. The measurement circuit 700 is also configured to: update the driver circuit 604A at an update frequency having a period that is a second integer number (e.g., T in FIG. 7) of cycles of the $CLK_{REF}$; digitize the sense signals at a frequency having a period that is a third integer number (e.g., S in FIG. 7) of cycles of the reference clock signal to produce a set of sense signal samples ($I_{sample}[n]$), where the number of sample in the set of sense signal samples is a fourth integer number (e.g., N in FIG. 7). The measurement circuit 700 also includes the control circuit 106, which is configured to minimize harmonics at the target frequency of ES(t) by selecting the first integer number, the second integer number, the third integer number, the fourth integer number, and the fifth integer number.

In some example embodiments, the control circuit 106 uses a linear congruence equation to determine harmonics that alias onto the target frequency of ES(t). The linear congruence equation may take the form $$nk = \left(k - p\frac{SN}{T} - m\frac{SN}{P}\right)(\mod N).$$

Selections of P,T,S,N,k by the control circuit 110 determine whether distortion components alias onto the excitation signal in DFT bin k. Options for solving the linear congruence equation include an exhaustive search option, a single prime factor option, a relatively prime factor option. With the exhaustive search option, best Signal-to-Interference-plus-Noise Ratio (SINR) estimates are obtained based on a predetermined battery unit impedance spectrum and analog anti-aliasing filter responses. With the single prime factor option, k, p, and m are selected to be relatively prime integers. S is selected to be a prime number such that the fclk_Hz/S is closest to the target sampling frequency fSamp_target_Hz. With the relatively prime factor option, k, p, and m are selected to be relatively prime integers. S is selected to be a number, relatively prime to all k, p, and m such that the fclk_Hz/S is closest to the target sampling frequency fSamp_target_Hz. The above-noted options for solving the linear congruence equation have some tradeoffs. For example, the exhaustive search option needs a predetermined battery unit impedance and analog filter responses as parameters. These parameters are not known exactly. The exhaustive search option also uses computation summing Bessel function weights to determine SINR. With the single prime factor option, there is a slightly larger difference between fclk_Hz/S and fSamp_target_Hz than the relatively prime factor option. Some of the described measurement circuit options rely on PWM control to generate ES(t) as described herein.

Figure 8:
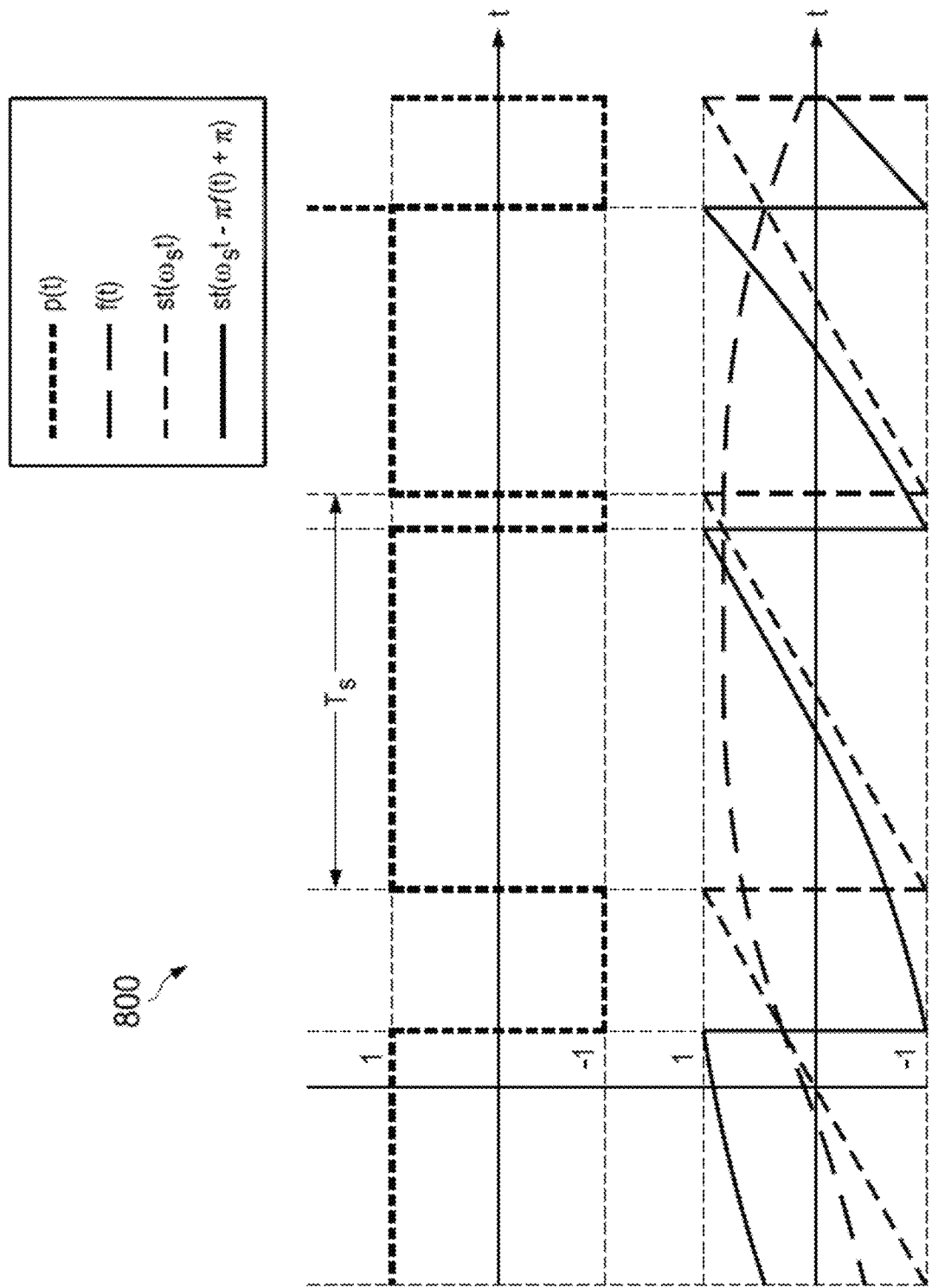
FIG. 8 is a graph of a PWM signal as a linear combination of sinusoid and sawtooth signals.

To understand the harmonic content of the signal coming from a PWM waveform generator (e.g., the PWM controller herein), consider a sinusoidal signal, $s_k(t)$, a sawtooth waveform, $st(\omega_{pwm}t)$, and a time-warped version of the sawtooth waveform, $st(\omega_{pwm}t-\pi s_k(t)+\pi)$ as shown in FIG. 8 for a single frequency, where FIG. 8 is a graph 800 of a PWM signal as a linear combination of sinusoid and sawtooth signals. The resulting PWM signal can be given as follows:

$$p_k(t) = s_k(t) - st(w_{pwm}t) + st(\omega_{pwm}t - \pi s_k(t) + \pi), \quad \text{Equation (6)}$$

where $\omega_{pwm}$ is the PWM frequency in units of rad/sec. Given that the Fourier series of a sawtooth form can be given as:

$$st(t) = \frac{j}{\pi}\sum_{\substack{m=-\infty \\ m \neq 0}}^{\infty} \frac{e^{jm(t+\pi)}}{m}, \quad \text{Equation (7)}$$

the PWM signal in the time domain can be given as:

$$p_k(t) = s_k(t) - st(\omega_{pwm}t) + \frac{j}{\pi}\sum_{\substack{m=-\infty \\ m \neq 0}}^{\infty} \frac{e^{jm(\omega_{pwm}t - \pi s_k(t))}}{m}. \quad \text{Equation (8)}$$

Figure 9:
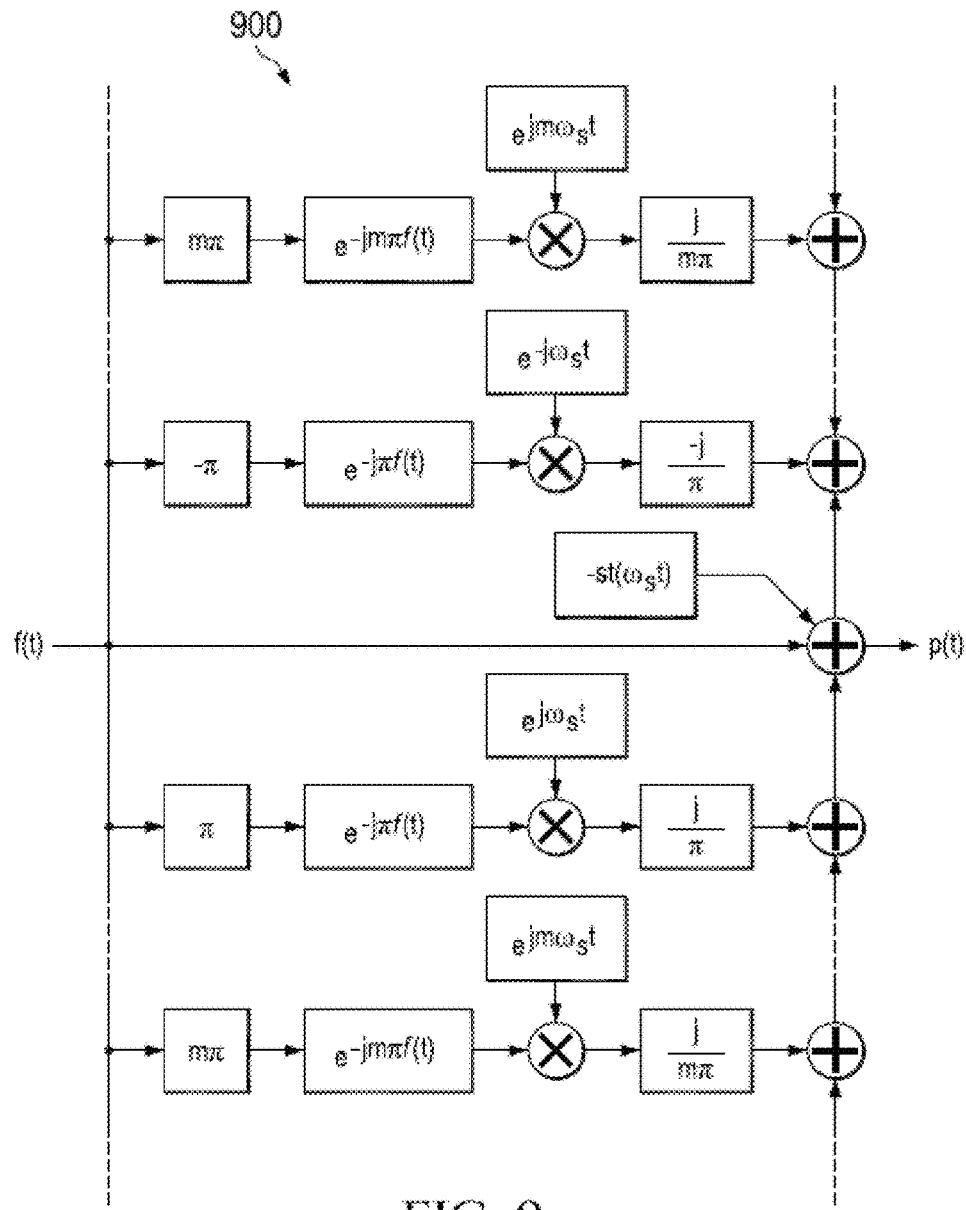
FIG. 9 is a diagram of $m^{th}$ term summation of signals to generate a PWM signal.
Figure 10:
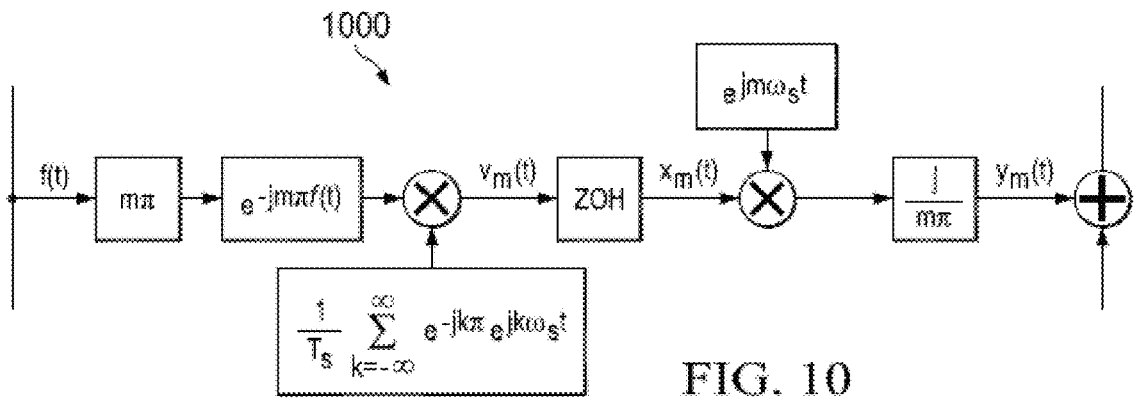
FIG. 10 is a diagram of a PWM duty cycle update in accordance with an example embodiment.

FIG. 9 is a diagram 900 of $m^{th}$ term summation of signals to generate a PWM signal in accordance with an example embodiment. FIG. 10 is a diagram 1000 of a PWM duty cycle update in accordance with an example embodiment. As shown in the diagram 1000, the frequency at which the duty cycle of the PWM controller is updated can be represented by a pulse train and a Zero-Order Hold (ZOH).

The signal $v_m(t)$ represents the PWM signal prior to sampling and quantization by a given ADC. It can be given as:

$$v_m(t) = \frac{1}{T_{tx}}\sum_{p=-\infty}^{\infty} e^{-jp\pi}e^{jp\omega_{pwm}t}e^{-jm\pi s_k(t)}. \quad \text{Equation (9)}$$

Knowing that $s_k(t) = A_k\cos(\omega_k t)$ and using the following Jacobi-Anger identity:

$$e^{-jm\pi A_k \cos(\omega_k t)} = \sum_{n=-\infty}^{\infty} (j)^n J_n(-m\pi A_k)e^{jn\omega_k t}, \quad \text{Equation (10)}$$

where $J_n(x)$ is a Bessel function of the first kind, the equation for $v_m(t)$ can be given as:

$$v_m(t) = \quad \text{Equation (11)}$$
$$\frac{1}{T_{tx}}\sum_{p=-\infty}^{\infty}\sum_{n=-\infty}^{\infty}(j)^n J_n(-m\pi A_k)e^{-jp\pi}e^{j(p\omega_{pwm}+n\omega_k)t}.$$

After the signal is multiplied by the impulse train shown in the diagram 1000 of FIG. 10, the result passes thru a ZOH operation. The ZOH block can be represented mathematically in the time domain as:

$$ZOH(t) = \begin{cases} 1 & 0 \leq t < T_{tx} \\ 0 & T_{tx} \leq t \end{cases}. \quad \text{Equation (12)}$$

The ZOH block can be represented mathematically in the frequency domain as:

$$ZOH(j\omega) = T_{tx}e^{-j\omega\frac{T_{tx}}{2}}\text{sinc}\left(\omega\frac{T_{tx}}{2}\right), \quad \text{Equation (13)}$$

where $T_{tx}$ is the duty cycle update period. Note that the update frequency is $$\omega_{tx} = \frac{2\pi}{T_{tx}}.$$

The signal after the ZOH, $x_m(t)$, can be given as:

$$x_m(t) = \qquad \text{Equation (14)}$$

$$\sum_{p=-\infty}^{\infty}\sum_{n=-\infty}^{\infty}(j)^n$$

$$J_n(-m\pi A_k)e^{-j t\pi}e^{j(p\omega_{tx}+n\omega_k)t}e^{j(p\omega_{tx}+n\omega_k)\frac{T_{tx}}{2}}.$$

$$\operatorname{sinc}\!\left((p\omega_{tx}+n\omega_k)\frac{T_{tx}}{2}\right).$$

Finally, the $m^{th}$ term of the summation, $y_m(t)$, can be given as:

$$y_m(t) = \qquad \text{Equation (15)}$$

$$\sum_{p=-\infty}^{\infty}\sum_{n=-\infty}^{\infty}\frac{(j)^{n+1}}{m\pi}J_n(-m\pi A_k)e^{-jp\pi}e^{-j(p\omega_{tx}+n\omega_k)\frac{T_{tx}}{2}}e^{j(p\omega_{tx}+m\omega_{pwm}+n\omega_k)t}.$$

$$\operatorname{sinc}\!\left((p\omega_{tx}+n\omega_k)\frac{T_{tx}}{2}\right).$$

By defining $\omega_T = p\omega_{tx}+m\omega_{pwm}+n\omega_k$, Equation 15 becomes $$y_m(t) = \qquad \text{Equation (16)}$$

$$\sum_{p=-\infty}^{\infty}\sum_{n=-\infty}^{\infty}\frac{(j)^{n+1}}{m\pi}J_n(-m\pi A_k)e^{-jp\pi}e^{-j(\omega_T-m\omega_{pwm})\frac{T_{tx}}{2}}e^{j\omega_T t}.$$

$$\operatorname{sinc}\!\left((\omega_T-m\omega_{pwm})\frac{T_{tx}}{2}\right).$$

The Fourier transform of the analog path, which includes the battery unit, the amplifier and the anti-aliasing filters can be given as:

$$H_a(j\omega)=F_{lp}(j\omega)\cdot H_{amp}(j\omega)\cdot B(j\omega). \qquad \text{Equation (17)}$$

Once $y_m(t)$ passes through the analog path, the signal can be given as:

$$y_m(t) = \sum_{p=-\infty}^{\infty}\sum_{n=-\infty}^{\infty} G(m,n,p)\cdot e^{j\omega_T t}, \qquad \text{Equation (18)}$$

where the gain term is defined to be:

$$G(m,n,p) = \qquad \text{Equation (19)}$$

$$\frac{(j)^{n+1}}{m\pi}H_a(j\omega_T)J_n(-m\pi A_k)e^{-jp\pi}e^{-j(\omega_T-m\omega_{pwm})\frac{T_{tx}}{2}}.$$

$$\operatorname{sinc}\!\left((\omega_T-m\omega_{pwm})\frac{T_{tx}}{2}\right).$$

Substituting back into the Equation 6, the PWM signal in the time domain can be given as:

$$p_k(t) = h_a(t)*(s_k(t)-st(\omega_{pwm}t)) + \qquad \text{Equation (20)}$$

$$\sum_{\substack{m=-\infty\\m\neq 0}}^{\infty}\sum_{p=-\infty}^{\infty}\sum_{n=-\infty}^{\infty} G(m,n,p)\cdot e^{j\omega_T t},$$

which now accounts for the analog signal path and the PWM update frequency. Substituting for the input signal gives:

$$p_k(t) = \frac{A}{2}\bigl(H_a(j\omega_k)e^{j\omega_k t}+H_a(-j\omega_k)e^{-j\omega_k t}\bigr) - \qquad \text{Equation (21)}$$

$$\frac{j}{\pi}\sum_{\substack{m=-\infty\\m\neq 0}}^{\infty} H_a(jm\omega_{pwm})\frac{e^{jm(\omega_{pwm}t+\pi)}}{m} +$$

$$\sum_{\substack{m=-\infty\\m\neq 0}}^{\infty}\sum_{p=-\infty}^{\infty}\sum_{n=-\infty}^{\infty} G(m,n,p)\cdot e^{j\omega_T t}.$$

After passing through the analog subsystem, the PWM-based signal is sampled by the ADC, which generates aliased components. If the ADC sampling frequency is denoted as:

$$\omega_s = 2\pi f_s = \frac{2\pi}{T_s} \qquad \text{Equation (22)}$$

and the excitation frequency is designed to appear at index k of a N-point DFT, where $$\frac{\omega_k}{f_s} = \omega_k T_s = \frac{2\pi k}{N}, \qquad \text{Equation (23)}$$

then the condition when an aliased frequency lands in the excitation signal DFT bin is given as:

$$\operatorname{mod}(\omega_T T_s, 2\pi) = \frac{2\pi k}{N}. \qquad \text{Equation (24)}$$

Equation 24 translates to:

$$\mathrm{mod}((p\omega_{tx} + m\omega_{pwm} + n\omega_k)T_s, 2\pi) = \frac{2\pi k}{N}. \quad \text{Equation (25)}$$

Each of the frequencies in Equation 25 can be expressed in terms of integer division with respect to a reference clock signal frequency, $f_{clk}$, as follows:

$$\omega_s = \frac{2\pi f_{clk}}{S}, \quad \text{Equation (26)}$$

$$\omega_{tx} = \frac{2\pi f_{clk}}{T}, \quad \text{Equation (27)}$$

$$\omega_{pwm} = \frac{2\pi f_{clk}}{P}, \text{ and} \quad \text{Equation (28)}$$

$$\omega_k = \frac{2\pi f_{clk}}{SN}k. \quad \text{Equation (29)}$$

The sampling control parameters S, T, and P are restricted to integers because the circuits that generate the excitation signal period, the ADC sampling period, the PWM duty cycle update period, and the PWM counter signal period are based on counters driven by a master clock running at frequency $f_{CLKREF}$. Substituting yields:

$$\mathrm{mod}\left(2\pi f_{REFCLK}\left(p\frac{1}{T} + m\frac{1}{P} + n\frac{k}{SN}\right)T_s, 2\pi\right) = \frac{2\pi k}{N}. \quad \text{Equation (30)}$$

With $S = 2\pi f_{clk}T_s$, the Equation 30 simplifies to:

$$\mathrm{mod}\left(\left(p\frac{S}{T} + m\frac{S}{P} + n\frac{k}{N}\right), 2\pi\right) = \frac{2\pi k}{N}. \quad \text{Equation (31)}$$

Multiplying each side of the equation by $$\frac{N}{2\pi}$$

yields:

$$\mathrm{mod}\left(\left(p\frac{SN}{T} + m\frac{SN}{P} + nk\right), N\right) = k. \quad \text{Equation (32)}$$

Equation 32 can be used to solve for S, T, P and N for given clock frequency, $f_{CLKREF}$, to minimize the probability of an aliased harmonic frequency landing on the excitation frequency bin k. Use of Equation 32 for aliasing is equivalent to a multi-dimensional linear congruence problem given as:

$$p\frac{SN}{T} + m\frac{SN}{P} + nk \equiv k(\mathrm{mod}\ N). \quad \text{Equation (33)}$$

Equation 33 can be re-written as a linear congruence as:

$$nk = \left(k - p\frac{SN}{T} - m\frac{SN}{P}\right)(\mathrm{mod}\ N). \quad \text{Equation (34)}$$

Note that the linear congruence $ax \equiv b(\mathrm{mod}\ c)$ has a solution when $d = \gcd(a, c)$ divides b, where $\gcd(a, c)$ is the greatest common divisor between arguments a and c. There are an infinite number of alias frequencies so there will always be an aliased component that lands on the excitation signal DFT index k. However, the goal is to make n sufficiently large so that the aliased component has minimal impact on the impedance measurement at the desired excitation frequency.

In some example embodiments, the control circuit 110 implements a frequency planning algorithm that selects the sampling control parameters P,T,S,N to define the PWM counter signal period, the PWM duty cycle update period, the ADC sampling period, and the number of sense signal samples (i.e., the DFT block size). The selections are made to achieve a set of measurement frequencies $\{\omega_k\}$ that approximate a target set of frequencies, subject to a constraint on SINR. For impedance spectroscopy, logarithmically distributed target frequencies match the behavior of the time constants for the relaxation modes for the battery unit. These target frequency plans are defined with respect to a pair of signal band edge frequencies, $f_{min} < f_{max}$. Given the signal band edges, a set of R logarithmically distributed target frequencies is:

$$f_r = f_{min} \exp\left(\frac{r \log(f_{max}/f_{min})}{R-1}\right), \quad \text{Equation (35)}$$

where the frequency index satisfies $0 \leq r \leq R-1$.

The PWM-based excitation signal can be designed to generate a single sinusoidal signal or the sum of two or more sinusoidal terms having frequencies selected from the set $\{f_r\}$. A direct computation of the frequency plan from the aliased harmonics and intermodulation frequencies determined by the excitation frequency, TX duty cycle update rate, and PWM frequency uses the exact form of the received signal $p_k(t)$. The signal spectrum can be determined in the frequency domain from this expression. Additionally, given a noise power spectral density $\sigma$ (units of $V/\sqrt{Hz}$) for the voltage measurement, the maximum frequency where harmonics are above the noise floor in a specified bandwidth can be determined. Let $f_*$ denote this frequency. Given a choice for the count periods used to generate the signal, PWM, update rate, sampling period, and DFT block size, the SINR can be approximated by summing the harmonics and intermodulation products with frequency less than $f_*$ that alias onto a candidate excitation signal DFT bin.

In some example embodiments, the SINR calculation depends on the impedance spectrum of the battery unit, in addition to known quantities such as the amplifier and anti-aliasing filter frequency responses. In computation of the approximate SINR, a typical battery unit impedance can be used in place of the measurement impedance. This typical impedance can be based on past measurement or offline characterization of the battery unit.

Figure 11:
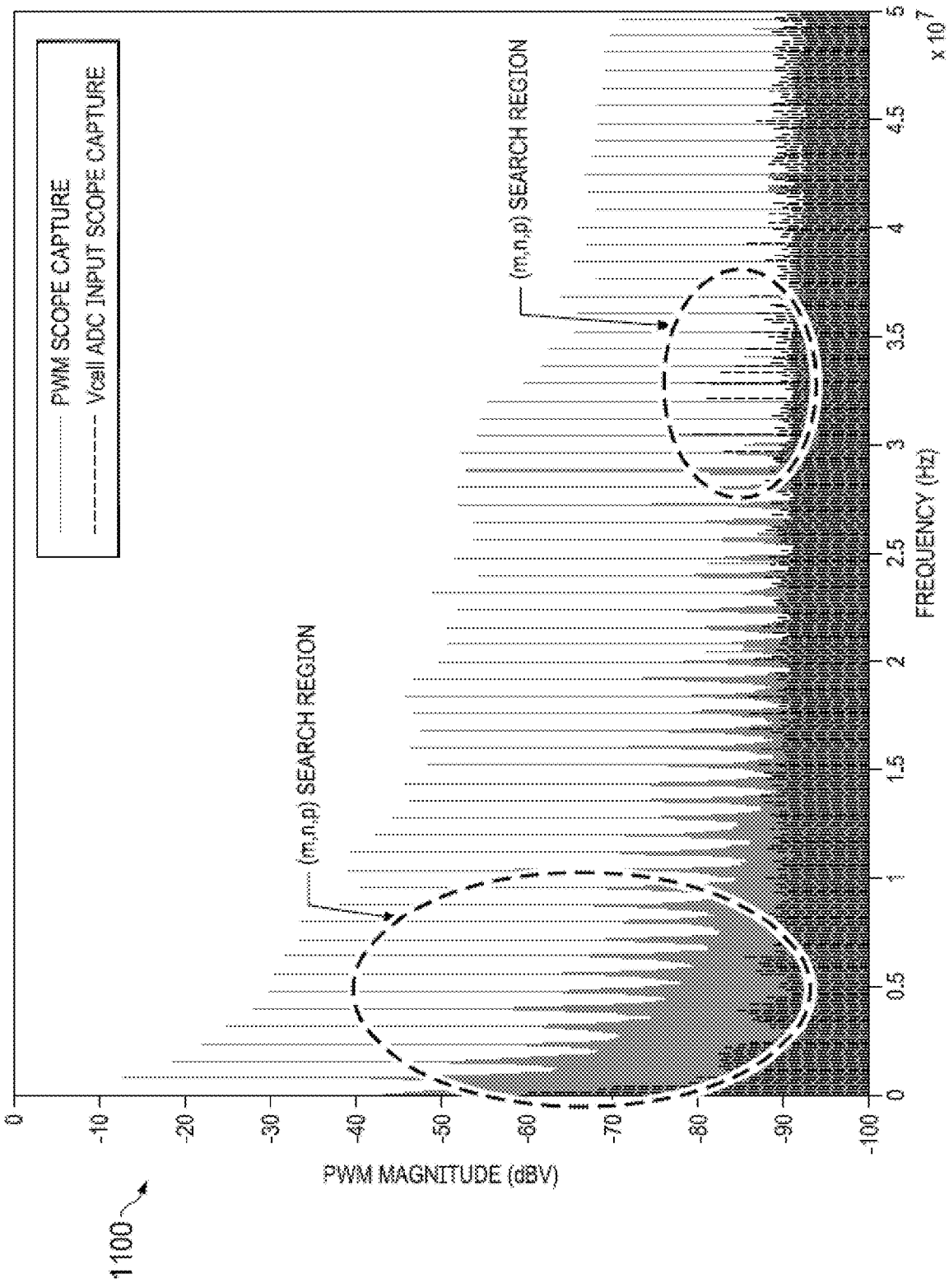
FIG. 11 is a graph showing PWM magnitude as a function of frequency and showing attenuation of signal harmonics in accordance with an example embodiment.

The exhaustive search option for the frequency plan parameters for target excitation frequency $f_i$ from the logarithmically spaced frequency distribution determines an excitation frequency that nearby that falls on DFT bin center and has SINR above the acceptance threshold. In some example embodiments, the steps in the exhaustive search option include: 1) set $\Delta f=f_0/3$ for DFT bin width (other integers besides 3 can be used, where the divisor changes the number of times the excitation signal is repeated over the DFT block size); 2) set N=round($\omega_s/2\pi\Delta f$); 3) set P=round ($2\pi f_{clk}/\omega_{pwm}$); 4) set T=round($2\pi f_{clk}/\omega_{tx}$); 5) set initial candidate for excitation signal DFT bin: k=round($f_i/\Delta f$); 6) set initial candidate for the ADC sample period count: S=round ($f_{clk}/f_s$); 7) compute approximate SINR for candidate k and S values to determine fundamental tone magnitude from $p_k(t)$ (check all harmonics and intermodulation products with frequency less than for the aliasing condition mod $$\left(\left(p\frac{SN}{T}+m\frac{SN}{P}+nk\right),N\right)=k;$$

sum the interference from those that satisfy it, add noise contribution $\sigma^2\Delta f$ to square of the sum to approximate the interference); 8) if approximate SINR exceeds acceptance threshold, select the parameters for the excitation frequency and terminate search; 9) if approximate SINR does exceed acceptance threshold, increment count of total candidates tested (if approximate SINR exceeds best value tested so far, save it); 10) if total candidates tested exceeds a termination count threshold, use the best values for k, S so far; and 11) adjust k, S in a search pattern and go to step 7 (these parameters are adjusted in a two-dimensional search near the original values determined in steps 5 and 6). In some example embodiments, the local search algorithm for step 11 uses a spiral in the two-dimensional grid of integer values for these parameters, centered on the initial values. FIG. 11 is a graph 1100 showing PWM magnitude as a function of frequency and showing attenuation of signal harmonics in accordance with an example embodiment. In the graph 1100, the m, p, and n search region is limited.

The exhaustive search option involves a significant amount of computation to determine the frequency plan. The magnitude of many harmonics and intermodulation tones is computed and summed in each stage of the search. Thus, the exhaustive search option may be challenging to implement in real-time on an embedded processor. There are heuristic sub-optimal algorithms that are more suitable for real-time implementation. They are based on the observation that the index of an interfering harmonic that satisfies the aliasing condition is smaller when the underlying DFT bin and period count values have common factors. Other search options involve constraining the count periods and DFT bins to be prime numbers, or relatively prime (no common divisors other than 1), which reduces the magnitude of the aliased harmonics or intermodulation products.

In some example embodiments, a single prime factor option is performed. In such example embodiments, the steps in the single prime factor option may include: 1) set $\Delta f=f_0/3$ for DFT bin width (other integers besides 3 can be used, where the divisor changes the number of times the excitation signal is repeated over the DFT block size); 2) set N=round($\omega_s/2\pi\Delta f$); 3) set P=round($2\pi f_{clk}/\omega_{pwm}$); 4) set T=round($2\pi f_{clk}/\omega_{tx}$); 5) set initial candidate for excitation signal DFT bin: $k_i$=round($f_i/\Delta f$); 6) perform a local search around the initial value of k to get the excitation frequency $f_i$ (set $k_i$ relatively prime with P and $k_j$ for j<i); and 7) search for ADC sampling frequency divisor. Step 7 may include the following: set initial candidate to be S=round($f_{clk}/f_{s,target}$)+q for an integer offset parameter q; test candidate divisor S for primality; and decrement by 1 until a prime number is reached).

In some example embodiments, a relatively prime option is performed. In such example embodiments, the steps in the relatively prime option may include: 1) set $\Delta f=f_0/3$ for DFT bin width (other integers besides 3 can be used, where the divisor changes the number of times the excitation signal is repeated over the DFT block size); 2) set N=round($\omega_s/2\pi\Delta f$); 3) set P=round($2\pi f_{clk}/\omega_{pwm}$); 4) set T=round($2\pi f_{clk}/\omega_{tk}$); 5) set initial candidate for excitation signal DFT bin: $k_i$=round($f_i/\Delta f$); 6) perform a local search around the initial value of k to get the excitation frequency $f_i$ (set $k_i$ relatively prime with P and $k_j$ for j<i); and 7) search for ADC sampling frequency divisor. Step 7 may include the following: set initial candidate to be S=round($f_{clk}/f_{s,target}$); test a candidate to determine whether it is relatively prime to $k_0, k_1, \ldots, k_{R-1}$ and P; if it is relatively prime, terminate the search; and if it is not relatively prime, decrement the candidate value of S and continue the search.

Figure 12:
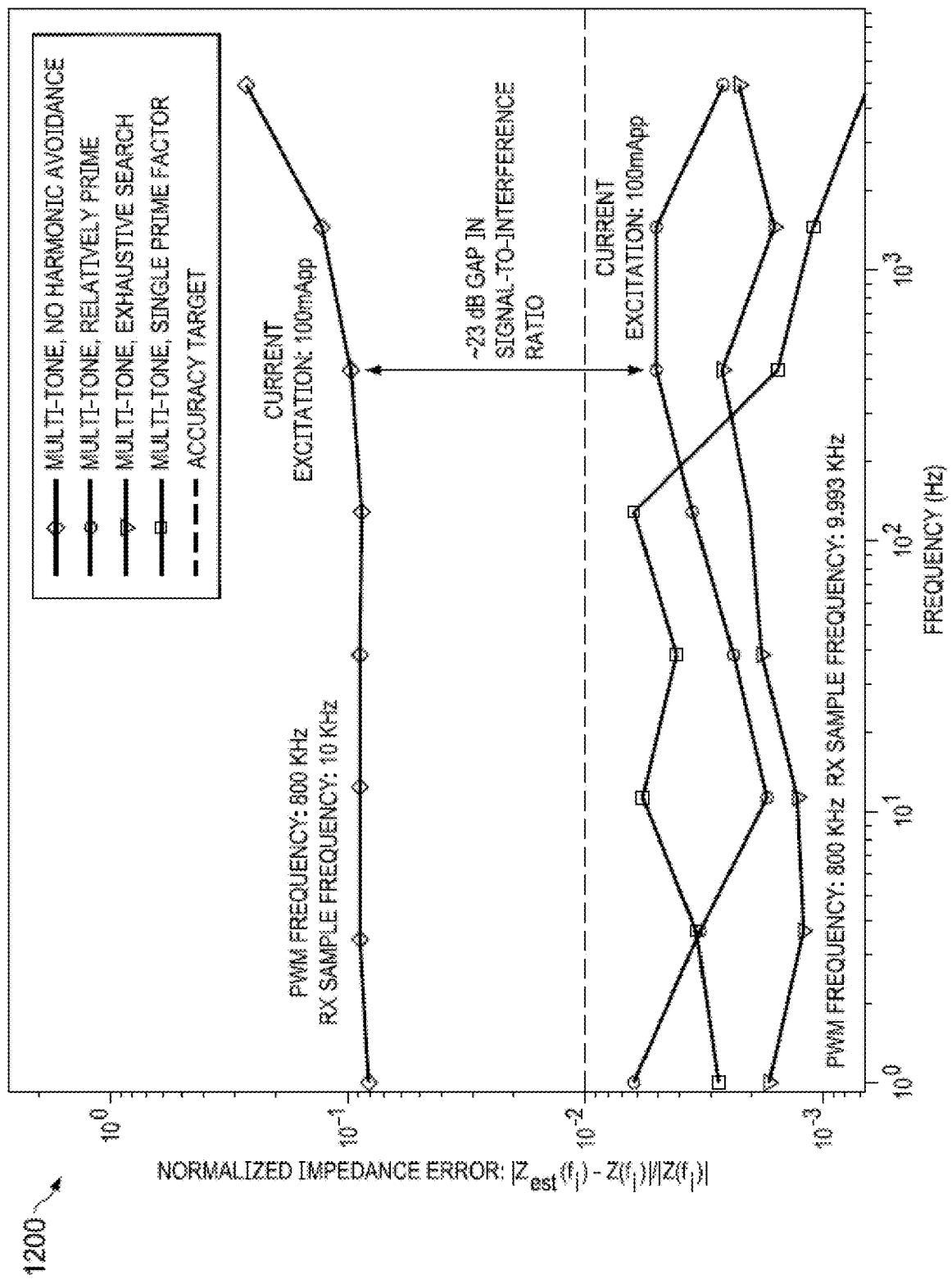
FIG. 12 is a graph showing normalized impedance error as a function of frequency and showing the effect of PWM harmonic avoidance in accordance with an example embodiment.

FIG. 12 is a graph 1200 showing normalized impedance error as a function of frequency and showing the effect of PWM harmonic avoidance in accordance with an example embodiment. In graph 1200, the impedance response error when no harmonic avoidance is not used and the impedance response error when harmonic avoidance is used are shown. Note there is a 23 dB improvement in the SINR when harmonic avoidance is used during the impedance measurement. In some example embodiments, more detail on the frequency plan may be added without harmonic avoidance by using 10 kHz sampling rate rather than 9993 Hz.

In a conventional approach, harmonic avoidance when sensing the voltage of a DUT is performed using square wave excitation. In this approach, only the sampling frequency is adjusted to avoid harmonics for a given square wave excitation frequency. In contrast, the described harmonic minimization involves adjusting the sampling frequency, the PWM frequency, the PWM update frequency and the DFT block size to minimize harmonic impact on the measured signals in the time domain and on the impedance estimate in the frequency domain.

The described techniques include methodologies to determine sampling frequency, PWM frequency, a PWM update frequency and the DFT block size in a manner that minimizes harmonic aliasing in voltage and current sensing and impedance estimation. The described techniques improve impedance estimation SINR by over 20 dB. The described techniques also enables design tradeoff between amplifier and ADC requirements (noise, number of bits) for a desired voltage and current sense accuracy. The described techniques additionally enable design tradeoff between amplifier and ADC requirements (noise, number of bits) for a desired impedance estimation error.

Figure 13:
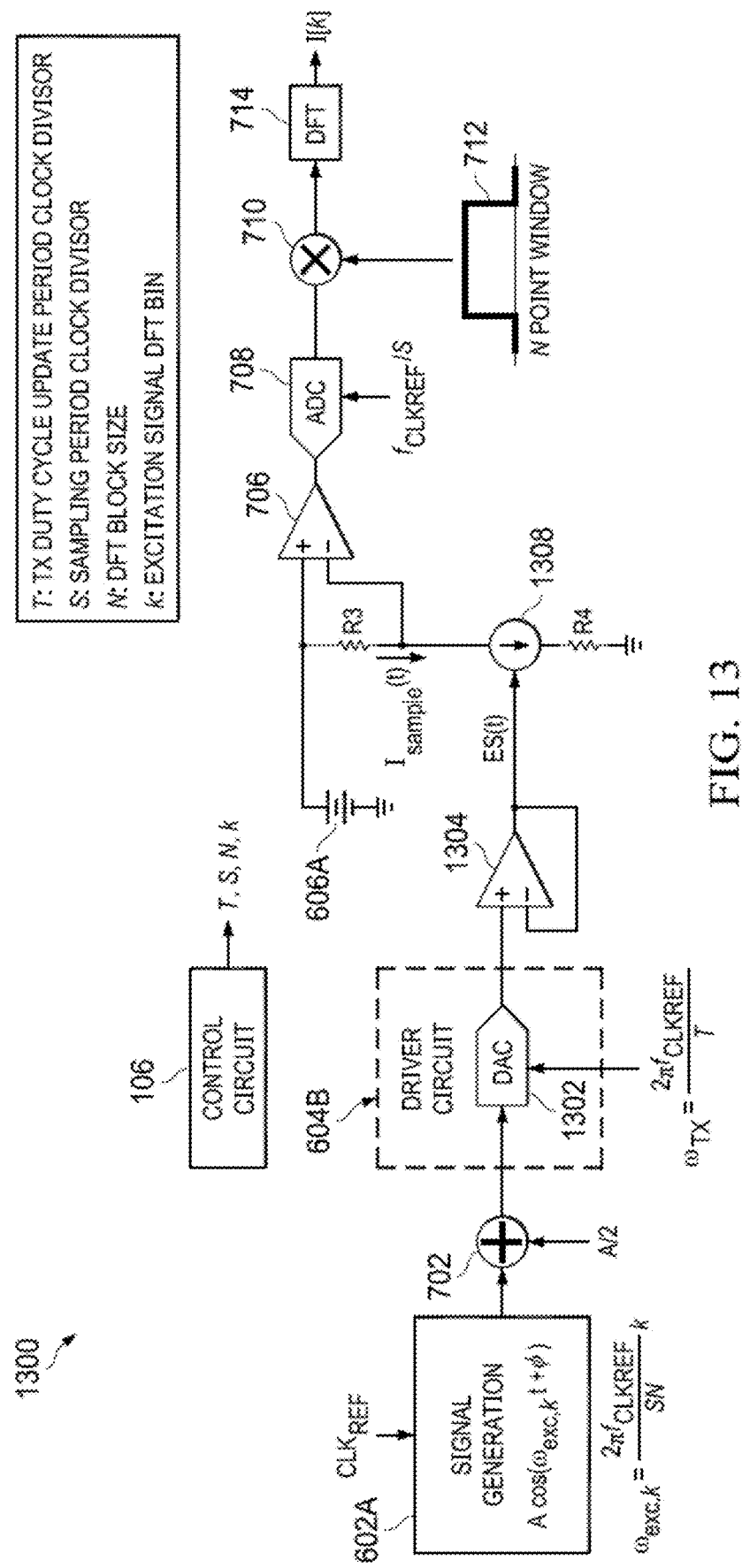
FIG. 13 is a diagram of a measurement circuit for a battery unit in accordance with yet another example embodiment.

In some example embodiments, a driver circuit (e.g., the driver circuit 130 in FIG. 1, or the driver circuit 604 in FIG. 6) uses a DAC instead of a PWM controller. FIG. 13 is a diagram of a measurement circuit 1300 for a battery unit in accordance with another example embodiment. The measurement circuit 1300 includes analog path components (e.g., the analog components 142 in FIG. 1), the ADC 708, and DFT components (e.g., the multiplier 710, a N point window selector 712, and the DFT circuit 714). The measurement circuit 1300 is similar to the measurement circuit 700 except the driver circuit 604B of FIG. 7. FIG. 13 includes a DAC 1302 rather than a PWM controller as in FIG. 7. As shown in FIG. 13, the measurement circuit 1300 includes the signal generator 602A (an example of the signal generator 602 in FIG. 6). The signal generator 602A is configured to receive REF$_{CLK}$ and generate the reference signal A cos ($\omega_{exc,k}$t+$\phi$). The output of the signal generator 602A is provided to a combine circuit 702, which adds a signal A/2 to the reference signal. The output of the combine circuit 702 is provided to the driver circuit 604B having an operating frequency of $$\omega_{TX} = \frac{2\pi f_{CLKREF}}{T}.$$

The output of the driver circuit 604B is coupled to a non-inverting input of an operational amplifier 1304. The inverting input and output (e.g., ES(t)) of the operational amplifier 1304 are coupled to the control terminal of a current source 1308. In other example embodiments, the operational amplifier 1304 may be omitted and/or the current source 1308 is replaced with a transistor controlled by ES(t). As another option, another resistor may be added in series with the current source (e.g., between the inverting input of the operational amplifier 706 and the current source 1308).

In the example of FIG. 13, ES(t) is provided from the output of the operational amplifier 1304 to a current source 1308 (an example of the external source 228). In some example embodiments, the current source 1308 includes a transistor controlled by ES(t). As shown, a first side of the current source 1308 is coupled to the inverting input of the operational amplifier 706, and a second side of the current source 1308 is coupled to ground via a resistor (R4). When the current source 1308 is on, a sample of the current through the battery unit 606A, I$_{sample}$(t), flows through a sense resistor (R3) coupled between inputs of the operational amplifier 706 (an example of the third operational amplifier 214 in FIGS. 2A and 3). The operational amplifier 706 amplifies I$_{sample}$(t), and the amplified I$_{sample}$(t) is provided to the ADC 708 (an example of the third ADC 226 in FIG. 2A, the third ADC 306 in FIG. 3, or the ADC 612 in FIG. 6). As shown, the ADC 708 is operated at a frequency of f$_{CLKREF}$/S, where S is sampling period clock divisor. The output of the ADC 708 is provided to the multiplier 710, which multiplies the output of the ADC 708 by the N point window 712. The output of the multiplier 710 is provided to the DFT block 714, which provides frequency domain values I[k] related to I$_{sample}$(t). As desired, the measurement circuit 1300 includes additional components to obtain frequency domain values (e.g., V$_{cell}$[k] and/or I$_{load}$[k]) from other sense signals.

In the example of FIG. 13, the measurement circuit 1300 is configured to generate a reference signal (A cos($\omega_{exc,k}$t $\phi$)); use the reference signal to generate an excitation signal ES(t) at a target frequency having a period that is a first integer number (e.g., S*N/k in FIG. 13) of cycles of the reference clock signal, the excitation signal resulting in sense signals related to the battery unit 606A; update the driver circuit 604A at an update frequency having a period that is a second integer number (e.g., Tin FIG. 13) of cycles of the CLK$_{REF}$; digitize the sense signals at a frequency having a period that is a third integer number (e.g., S in FIG. 13) of cycles of the reference clock signal to produce a set of sense signal samples (I$_{sample}$[n]), where the number of sense signal samples in the set is a fourth integer number (e.g., N in FIG. 13). The measurement circuit 1300 also includes the control circuit 106, which is configured to minimize harmonics at the target frequency of ES(t) based on the first integer number, the second integer number, the third integer number, and the fourth integer number.

In some example embodiments, the control circuit 110 uses a linear congruence equation to determine harmonics that alias onto the target frequency of ES(t). The linear congruence equation may take the form: mod $$\left(2\pi\left(p\frac{S}{T} \pm \frac{k}{N}\right), 2\pi\right) = \frac{2\pi k}{N},$$

which reduces to $$p\frac{S}{T} = 0(\text{mod}1).$$

Selections of T,S,N,k by the control circuit 110 determine whether distortion component aliases onto the excitation signal in DFT bin k. Other relevant considerations include alias interference given as: p($\alpha$S)=N−2k(mod N), where $$\alpha = \frac{N}{T}$$

to restrict alias to DFT bins. Another linear congruence option is ax≡b(mod c), which has a solution when d=gcd(a, c) divides b, where gcd(a, c) is the greatest common divisor between arguments a and c.

With the measurement circuit 1300, conditions for minimizing self-harmonic aliasing include: linear congruence satisfied by p=T/gcd(S,T); frequency of interfering alias maximized when S, T are relatively prime; and alias interference being negligible when alias falls at frequency $\omega_{alias}$=p$\omega_{TX}$=2$\pi$pf$_{clk}$/T=f$_{clk}$. For p=T, and f$_{clk}$≥≥f$_{3dB}$, an analog filter with cutoff f$_{3dB}$ suppresses the alias well; and sampling rate selection with exact integer oversampling (f$_{TX}$=2f$_s$) has interference from alias with index p=1, at frequency f$_{TX}$ (resulting in much lower filter rejection than at f$_{CLKREF}$). Conditions for minimizing aliasing from negative frequency tone include: a greatest common divisor: $\alpha$=gcd($\alpha$S, N) since S,T are relatively prime, N=$\alpha$T; and congruence has no solutions (i.e., no alias interference) when N−2k not divisible by $\alpha$.

In some example embodiments, the search algorithm for a DAC scenario is based on f$_{CLKREF}$ and a list of target excitation frequencies {f$_{targ,0}$, f$_{targ,1}$, . . . f$_{targ,L-1}$}. If the maximum frequency parameter satisfies f$_{max}$>f$_{targ,l}$ for 0≤l≤L−1, the search determines T, S, N, $\alpha$ and DFT bin indices {k$_0$, k$_1$, . . . , k$_{L-1}$} using the following steps: 1) set k$_{min}$=2 as minimum active DFT bin; 2) set $\alpha$=3; 3) select a prime number for T satisfying T<f$_{clk}$/2f$_{max}$ (TX sampling frequency is $$f_{TX} = \frac{f_{CLKREF}}{T});$$

4) select a second prime number for S satisfying S<f$_{clk}$/2f$_{max}$ (RX sampling frequency is $$f_s = \frac{f_{CLKREF}}{S});$$

5) set N=αT; 6) let Δt=f$_s$/f$_{clk}$; 7) set k$_{i,init}$=round(f$_{targ,i}$/Δf); and 8) perform a local search around k$_{i,init}$ to get the excitation frequency f$_i$. In some example embodiments, step 8 involves selecting a closest index k$_i$ that is relatively prime to α and k$_j$ for j<i. Based on the search, the output frequencies:

$$f_l = \frac{k_l}{N} f_s.$$

In a conventional approach, harmonic avoidance when sensing the voltage of a device under test (DUT) is performed using square wave excitation. In this approach, only the sampling frequency is adjusted to avoid harmonics for a given square wave excitation frequency. In contrast, the described harmonic minimization involves adjusting sampling control parameters (T, S, N, and k; or P, T, S, N, and k) to minimize harmonic impact on the measured signals in the time domain and on the impedance estimate in the frequency domain.

The described DUT sampling techniques include methodologies to determine the values for the sampling control parameters (T, S, N, and k; or P, T, S, N, and k) in a manner that minimizes harmonic aliasing in voltage and current sensing and impedance estimation. With the described DUT sampling techniques, impedance estimation SINR improves by over 20 dB over conventional technique. The described DUT sampling techniques enables design tradeoff between amplifier and ADC requirements (noise, number of bits) for a desired voltage and current sense accuracy. The described DUT sampling techniques additionally enable design tradeoff between amplifier and ADC requirements (noise, number of bits) for a desired impedance estimation error. For a DAC-based sampling technique, the described harmonic minimization involves adjusting T, S, N, and k to minimize harmonic impact on the measured signals in the time domain and on the impedance estimate in the frequency domain. For a PWM-based sampling technique, the described harmonic minimization involves adjusting P, T, S, N, and k to minimize harmonic impact on the measured signals in the time domain and on the impedance estimate in the frequency domain.

Figure 14:
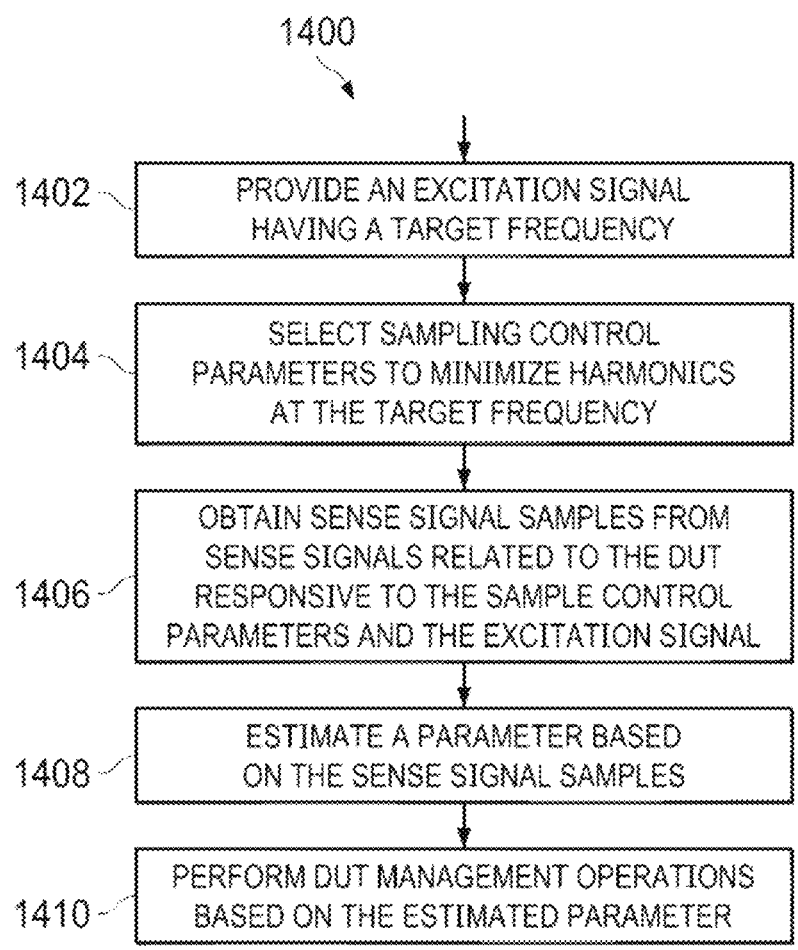
FIG. 14 is a flowchart of a device under test (DUT) management method in accordance with an example embodiment.

FIG. 14 is a flowchart of a DUT management method 1400 in accordance with some example embodiments. The method 1400 is performed, for example, by a DUT management circuit (e.g., the DUT management circuit 102 in FIG. 1). As shown, the method 1400 includes providing an excitation signal having a target frequency at block 1402. At block 1404, sampling control parameters are selected to minimize harmonics at the target frequency. At block 1406, sense signal samples are obtained from sense signals related to the DUT responsive to the sampling control parameters and the excitation signal. At block 1408, a parameter is estimated based on the sense signal samples. At block 1410, DUT management operations are performed based on the estimated parameter.

In some example embodiments, the sampling control parameters include: a first period for the excitation signal, the first period being a first integer number of cycles of a reference clock signal; a second period for updating the excitation signal, the second period being a second integer number of cycles of the reference clock signal; a third period for digitizing sense signals to produce the sense signal samples, the third period being a third integer number of cycles of the reference clock signal; a discrete Fourier transform (DFT) block size having a fourth integer number of samples. In some example embodiments, the sampling control parameters include a fourth period for an excitation control signal used to generate the excitation signal. The fourth period is a fifth integer number of cycles of the reference clock signal, where the first integer number is a function of the product of the third and fourth integer numbers divided by a frequency index of the excitation signal. In some example embodiments, the method 1400 also includes attenuating frequency content of the sense signals above half a sampling frequency of the ADC.

In some example embodiments, a circuit (e.g., the measurement circuit 104 in FIG. 1, or related components in 2A, 2B, 3, 6, 7, and 13) for determining a parameter of a DUT includes: a clock circuit (e.g., the clock 601) configured to generate a reference clock signal (e.g., CLK$_{REF}$ herein); and a driver circuit (e.g., the driver circuit 604 in FIG. 6, the driver circuit 604A in FIG. 7, or the driver circuit 604B in FIG. 13) configured to use the reference clock signal to generate an excitation signal (e.g., ES(t) in FIG. 6) at a target frequency having a period that is a first integer number of cycles of the reference clock signal. The circuit also includes: an update circuit (e.g., S1 in FIG. 7) configured to update the driver circuit at an update frequency having a period that is a second integer number of cycles of the reference clock signal; and an ADC (e.g., ADC 612 in FIG. 6, or ADC 708 in FIGS. 7 and 13) configured to digitize the sense signals at a frequency having a period that is a third integer number of cycles of the reference clock signal to produce sense signal samples (e.g., V$_{cell}$[n] and/or I$_{sample}$[n] in FIG. 6). The circuit also includes a data selection circuit (e.g., the N point window selector 712 in FIGS. 7 and 13) configured to identify a set of sense signal samples, the set having a fourth integer number of samples. The circuit also includes a control circuit (e.g., the control circuit 106 in FIGS. 1, 7, and 13) configured to minimize harmonics at the target frequency of the excitation signal based on the first integer number, the second integer number, the third integer number, and the fourth integer number.

In some examples, the circuit includes: a transistor (e.g., Q1 in FIGS. 2A and 3, S1 in FIG. 7, a transistor of the external source 228 in FIG. 2B, or a transistor of the current source 1308) having a control terminal configured to receive the excitation signal, and anti-aliasing filters (e.g., the LPF circuitry in FIGS. 2A, 2B, 3, and 6) configured to attenuate frequency content of the sense signals above half a sampling frequency of the ADC.

In some example embodiments, the driver circuit includes a digital-to-analog converter (DAC). In other example embodiments, the driver circuit includes a PWM controller and the circuit further comprises an excitation signal generator coupled to the driver circuit and configured to provide an excitation control signal to the PWM controller. The excitation control signal has a frequency with a period that is a fifth integer number of cycles of the reference clock signal. The first integer number is a function of the product of the third and fourth integer numbers divided by a frequency index of the excitation signal. In some example embodiments, the excitation signal generator is configured to generate single-tone excitations and multi-tone excitations for the reference signal.

In some example embodiments, the control circuit is configured to minimize harmonics at the target frequency of the excitation signal based on a linear congruence of the form $$nk = \left(k - p\frac{SN}{T} - m\frac{SN}{P}\right)(\mathrm{mod}\ N),$$

where k is the frequency index of the excitation signal, S is the third integer number, N is the fourth integer number of sense signal samples, S*N/k is the first integer number, T is the second integer number, P is the fifth integer number, p is an integer, m is an integer, and n is an integer. In some example embodiments, the first, second, third and fifth integers are selected to maximize an approximate Signal-to-Interference-plus-Noise Ratio (SINR) for the sense signals.

In some example embodiments, a ratio of the product of the third and fourth integer numbers to the first integer number is an integer that is relatively prime to the fifth integer number. Also, the third integer number is relatively prime to the fifth integer number and relatively prime to the ratio of the product of the third and fourth integer numbers to the first integer number. In some example embodiments, a ratio of the product of the third and fourth integer numbers to the first integer number is an integer that is relatively prime to the fifth integer number, and the third integer number is a prime number.

In some example embodiments, the DUT is a battery unit, the sense signals indicate voltage across the battery unit and current through the battery unit, and the parameter is impedance of the battery unit. In some example embodiments, the circuit further comprises an parameter estimator configured to estimate the impedance of the battery unit based on the sense signal samples.

In some example embodiments, a system (e.g., the system 100 in FIG. 1, the battery unit management system 200 in FIG. 2, the battery unit management system 300 in FIG. 3) includes: a measurement circuit (e.g., the measurement circuit 104 in FIGS. 1 and 2, the measurement circuit 104A in FIG. 3, the measurement circuit 600 in FIG. 6, the measurement circuit 700 in FIG. 7, or the measurement circuit 1300 in FIG. 13) adapted to be coupled to a DUT (e.g., the DUT 122 in FIG. 1, the battery unit 218 in FIGS. 2 and 3, the DUT 606 in FIG. 6, the battery unit 606A in FIGS. 7 and 13). The measurement circuit has a sampler circuit (e.g., the sampler circuit 106 in FIG. 1, related components in the measurement circuit 600 in FIG. 6, related components in the measurement circuit 700, or related components in the measurement circuit 1300). The sampler circuit includes a switch (e.g., Q1 in FIGS. 2 and 3, S2 in FIG. 7, or S3 in FIG. 13) having a control terminal. The sample circuit also includes a driver circuit (e.g., the driver circuit 604 in FIG. 6, the driver circuit 604A in FIG. 7, or the driver circuit 604B in FIG. 13) coupled to the control terminal of the switch and configured to provide an excitation signal (e.g., ES(t) in FIGS. 6, 7, and 13) having a target frequency to the switch. The excitation signal determines a timing of voltage samples and current samples obtained from the DUT. The sampler circuit also includes: a control circuit configured to minimize harmonics at the target frequency of the excitation signal; and an ADC (e.g., the ADC 612 in FIG. 6, or the ADC 708 in FIG. 7 or 13) configured to digitize the voltage samples and current samples. In some example embodiments, the components described for the measurement circuit 600 in FIG. 6, the measurement circuit 700 in FIG. 7, or the measurement circuit 1300 in FIG. 13 are components of the sampler circuit. The measurement circuit may additionally include a parameter estimator (e.g., the parameter estimator 112 in FIG. 1) configured to estimate a parameter of the DUT based on the digitized voltage samples and current samples.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

As used herein, the terms "electrode", "node", "interconnection", "pin", "contact", and "connection" are used interchangeably. Unless specifically stated to the contrary, these terms are generally used to mean an interconnection between or a terminus of a device element, a circuit element, an integrated circuit, a device or other electronics or semiconductor component.

The example embodiments above may utilize switches in the form of n-type metal-oxide semiconductor field-effect transistors (nMOSFET or just "nMOS") or pMOS transistors. Other example embodiments may utilize NPN bipolar junction transistors (BJTs), PNP BJTs, or any other type of transistor. Hence, when referring to a current electrode, such electrode may be an emitter, collector, source or drain. Also, the control electrode may be a base or a gate.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in this description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described embodiments, and other embodiments are possible, within the scope of the claims.

What is claimed is:

1. A circuit comprising:
a driver circuit having a clock input, a first frequency control input, and a driver output, the driver output coupled to a device under test (DUT) terminal;
a DUT parameter circuit having a processing input, a second frequency control input, and a DUT parameter output, the processing input coupled to the DUT terminal; and
a control circuit having a first frequency control output and a second frequency control output, the first frequency control output coupled to the first frequency control input, and the second frequency control output coupled to the second frequency control input.

2. The circuit of claim 1, wherein:
the driver circuit is configured to:
receive a reference clock signal at the clock input; and
responsive to a first control signal at the first frequency control input, generate an
excitation signal at a target frequency having a period that is a first integer
number of cycles of the reference clock signal;
the control circuit has a third frequency control output and a fourth frequency control output;
the circuit further comprises an update circuit having a third frequency control input coupled to the third frequency control output, the update circuit configured to, responsive to a second control signal at the third frequency control input, update the driver circuit at an update frequency having a period that is a second integer number of cycles of the reference clock signal; and
the DUT parameter circuit has a fourth frequency control input coupled to the fourth frequency control output and includes:
an analog-to-digital converter (ADC) configured to:
receive sense signals at the DUT terminal; and
responsive to a third control signal at the second frequency control input, digitize the sense signals at a frequency having a period that is a third integer number of cycles of the reference clock signal to produce sense signal samples; and
a data selection circuit configured to, responsive to a fourth control signal at the fourth frequency control input, identify a set of sense signal samples, the set having a fourth integer number of samples; and
a parameter estimator circuit configured to provide a DUT parameter at the DUT parameter output based on the set of sense signal samples.

3. The circuit of claim 2, wherein:
the control circuit has a fifth frequency control output;
the driver circuit includes a pulse-width modulation (PWM) controller; and
the circuit further comprises an excitation signal generator having a fifth frequency control input and a generator output, the fifth frequency control input coupled to the fifth frequency control output, the PWM controller coupled to the driver circuit, and the excitation signal generator configured to, responsive to a fifth control signal at the fifth frequency control input, provide an excitation control signal to the PWM controller, the excitation control signal having a frequency having a period that is a fifth integer number of cycles of the reference clock signal.

4. The circuit of claim 3, wherein the excitation signal generator is configured to generate the excitation control signal to provide single-tone excitations and multi-tone excitations.

5. The circuit of claim 3, wherein the control circuit is configured to minimize harmonics at the target frequency of the excitation signal based on a linear congruence of the form $$nk = \left(k - p\frac{SN}{T} - m\frac{SN}{P}\right)(\bmod N),$$

where k is the frequency index of the excitation signal, S is the third integer number, N is the fourth integer number of sense signal samples, S*N/k is the first integer number, T is the second integer number, P is the fifth integer number, p is an integer, m is an integer, and n is an integer.

6. The circuit of claim 3, wherein the first, second, third and fifth integers are selected to maximize an approximate Signal-to-Interference-plus-Noise Ratio (SINR) for the sense signals.

7. The circuit of claim 3, wherein a ratio of a product of a third and fourth integer numbers to the first integer number is an integer that is relatively prime to the fifth integer number; and the third integer number is relatively prime to the fifth integer number and relatively prime to the ratio of the product of the third and fourth integer numbers to the first integer number.

8. The circuit of claim 3, wherein a ratio of a product of the third and fourth integer numbers to the first integer number is an integer that is relatively prime to the fifth integer number, and the third integer number is a prime number.

9. The circuit of claim 3, wherein the sense signals indicate voltage across a battery unit and current through the battery unit, and the DUT parameter is impedance of the battery unit.

10. The circuit of claim 1, wherein the driver circuit includes a digital-to-analog converter (DAC) having an output coupled to the driver output.

11. The circuit of claim 3, wherein the update circuit includes a switch coupled between the excitation signal generator and the PWM controller, the switch having a control terminal coupled to the fifth frequency control input.

12. The circuit of claim 10, further comprising a current source coupled to the DUT terminal, the current source having a control terminal coupled to the driver output.

13. A system comprising:
a measurement circuit including:
- a driver circuit having a clock input, a first frequency control input, and a driver output, the driver output coupled to a device under test (DUT) terminal;
- a DUT parameter circuit having a processing input, a second frequency control input, and a DUT parameter output, the processing input coupled to the DUT terminal; and
- a control circuit having a first frequency control output and a second frequency control output, the first frequency control output coupled to the first frequency control input, and the second frequency control output coupled to the second frequency control input.

14. The system of claim 13, wherein:
the driver circuit is configured to:
- receive a reference clock signal at the clock input; and
- responsive to a first control signal at the first frequency control input, generate an excitation signal at a target frequency having a period that is a first integer number of cycles of the reference clock signal;

the control circuit has a third frequency control output and a fourth frequency control output;
the measurement circuit further includes an update circuit having a third frequency control input coupled to the third frequency control output, the update circuit configured to, responsive to a second control signal at the third frequency control input, update the driver circuit at an update frequency having a period that is a second integer number of cycles of the reference clock signal; and
the DUT parameter circuit has a fourth frequency control input coupled to the fourth frequency control output and includes:
- an analog-to-digital converter (ADC) configured to:
  - receive sense signals at the DUT terminal; and
  - responsive to a third control signal at the second frequency control input, digitize the sense signals at a frequency having a period that is a third integer number of cycles of the reference clock signal to produce sense signal samples; and
- a data selection circuit configured to, responsive to a fourth control signal at the fourth frequency control input, identify a set of sense signal samples, the set having a fourth integer number of samples; and
- a parameter estimator circuit configured to provide a DUT parameter at the DUT parameter output based on the set of sense signal samples.

15. The system of claim 14, wherein:
the control circuit has a fifth frequency control output;
the driver circuit includes a pulse-width modulation (PWM) controller; and
the measurement circuit further includes an excitation signal generator having a fifth frequency control input and a generator output, the fifth frequency control input coupled to the fifth frequency control output, the PWM controller coupled to the driver circuit, and the excitation signal generator configured to, responsive to a fifth control signal at the fifth frequency control input, provide an excitation control signal to the PWM controller, the excitation control signal having a frequency having a period that is a fifth integer number of cycles of the reference clock signal.

16. The system of claim 15, wherein the control circuit is configured to minimize harmonics at the target frequency of the excitation signal based on a linear congruence of the form $$nk = \left(k - p\frac{SN}{T} - m\frac{SN}{P}\right)(\bmod N),$$

where k is the frequency index of the excitation signal, S is the third integer number, N is the fourth integer number of sense signal samples, S*N/k is the first integer number, T is the second integer number, P is the fifth integer number, p is an integer, m is an integer, and n is an integer.

17. The system of claim 15, wherein the first, second, third and fifth integer numbers are selected to minimize an approximate Signal-to-Interference-plus-Noise Ratio (SINR) for the excitation signal.

18. The system of claim 15, wherein a ratio of a product of a third and fourth integer numbers to the first integer number is an integer that is relatively prime to the fifth integer number; and the third integer number is relatively prime to the fifth integer number and relatively prime to a ratio of the product of the third and fourth integer numbers to the first integer number.

19. The system of claim 15, wherein a ratio of a product of a third and fourth integer numbers to the first integer number is an integer that is relatively prime to the fifth integer number, and the third integer is a prime number.

20. A method for device under test (DUT) management, the method comprising:
- providing, by a DUT management circuit, an excitation signal having a target frequency;
- controlling, by the DUT management circuit, sampling control parameters based on harmonics at the target frequency;
- obtaining, by the DUT management circuit, sense signal samples from sense signals related to the DUT responsive to the sampling control parameters and the excitation signal;
- estimating, by the DUT management circuit, a parameter based on the sense signal samples; and
- performing, by the DUT management circuit, DUT management operations based on the estimated parameter.

21. The method of claim 20, wherein the sampling control parameters include:
- a first period for the excitation signal, the first period being a first integer number of cycles of a reference clock signal;
- a second period for updating the excitation signal, the second period being a second integer number of cycles of the reference clock signal;
- a third period for digitizing sense signals to produce the sense signal samples, the third period being a third integer number of cycles of the reference clock signal;
- a discrete Fourier transform (DFT) block size having a fourth integer number of samples.

22. The method of claim 21, wherein the sampling control parameters includes a fourth period for an excitation control signal used to generate the excitation signal, the fourth period being a fifth integer number of cycles of the reference clock signal, wherein the fifth integer number is a function of a product of the third and fourth integer numbers divided by a frequency index of the excitation signal.

23. The method of claim 20, further comprising attenuating frequency content of the sense signals above half a frequency of sampling the sense signals to obtain the sense signal samples.

* * * * *